(12) United States Patent  
Homma et al.

(10) Patent No.: US 12,525,577 B2  
(45) Date of Patent: Jan. 13, 2026

(54) SEMICONDUCTOR DEVICE AND MANUFACTURING METHOD

(71) Applicant: Kioxia Corporation, Tokyo (JP)

(72) Inventors: Soichi Homma, Yokkaichi Mie (JP); Chikara Miyazaki, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 605 days.

(21) Appl. No.: 17/821,632

(22) Filed: Aug. 23, 2022

(65) Prior Publication Data

US 2023/0307419 A1    Sep. 28, 2023

(30) Foreign Application Priority Data

Mar. 23, 2022 (JP) ................................. 2022-047566

(51) Int. Cl.
*H01L 25/065* (2023.01)
*H01L 21/56* (2006.01)
(Continued)

(52) U.S. Cl.
CPC ........ *H01L 25/0657* (2013.01); *H01L 21/568* (2013.01); *H01L 24/11* (2013.01);
(Continued)

(58) Field of Classification Search
CPC . H01L 2224/04105; H01L 2224/12105; H01L 25/0657; H01L 21/568;
(Continued)

(56) References Cited

U.S. PATENT DOCUMENTS 9,716,080 B1 * 7/2017 Chuang ............. H01L 23/49838
9,905,529 B2    2/2018 Sakata et al.
(Continued)

FOREIGN PATENT DOCUMENTS

JP    2016-162985 A    9/2016
JP    2017-22213 A    1/2017
(Continued)

*Primary Examiner* — Jessica S Manno
*Assistant Examiner* — Ricky Verdes
(74) *Attorney, Agent, or Firm* — Finnegan, Henderson, Farabow, Garrett & Dunner, LLP

(57) ABSTRACT

A semiconductor device of an embodiment includes: a first semiconductor element; a first insulating resin that seals the first semiconductor element; a wiring substrate having a pad; a first wiring that extends from the first semiconductor element toward the wiring substrate, and has a first head portion and a first column portion, the first column portion connected to the first semiconductor element and the first head portion exposed on a surface of the first insulating resin; and a first conductive bonding agent that electrically connects the first head portion of the first wiring and the pad. When a surface of the first head portion facing a side of the first insulating resin is defined as a first surface. A surface of the first insulating resin on a side of the wiring substrate is defined as a second surface. A distance from a surface of the wiring substrate on a side of the first insulating resin to the first surface is defined as a first distance, and a distance from a surface of the wiring substrate on the side of the first insulating resin to the second surface is defined as a second distance. The first distance is shorter than the second distance.

20 Claims, 25 Drawing Sheets

(51) Int. Cl.
*H01L 23/00* (2006.01)
*H01L 25/18* (2023.01)

(52) U.S. Cl.
CPC .............. *H01L 24/13* (2013.01); *H01L 24/16* (2013.01); *H01L 24/81* (2013.01); *H01L 24/95* (2013.01); *H01L 25/18* (2013.01); *H01L 24/45* (2013.01); *H01L 24/48* (2013.01); *H01L 2224/11002* (2013.01); *H01L 2224/11013* (2013.01); *H01L 2224/11312* (2013.01); *H01L 2224/11464* (2013.01); *H01L 2224/11831* (2013.01); *H01L 2224/13018* (2013.01); *H01L 2224/13111* (2013.01); *H01L 2224/13147* (2013.01); *H01L 2224/16227* (2013.01); *H01L 2224/16238* (2013.01); *H01L 2224/43825* (2013.01); *H01L 2224/45139* (2013.01); *H01L 2224/45144* (2013.01); *H01L 2224/45147* (2013.01); *H01L 2224/45664* (2013.01); *H01L 2224/48105* (2013.01); *H01L 2224/48145* (2013.01); *H01L 2224/81193* (2013.01); *H01L 2224/8121* (2013.01); *H01L 2224/81815* (2013.01); *H01L 2224/81951* (2013.01); *H01L 2224/95* (2013.01); *H01L 2225/06506* (2013.01); *H01L 2225/06517* (2013.01); *H01L 2225/06562* (2013.01)

(58) Field of Classification Search
CPC ......... H01L 24/11; H01L 24/13; H01L 24/16; H01L 24/81; H01L 24/95; H01L 25/18; H01L 24/45; H01L 24/48; H01L 2224/11002; H01L 2224/11013; H01L 2224/11312; H01L 2224/11464; H01L 2224/11831; H01L 2224/13018; H01L 2224/13111; H01L 2224/13147; H01L 2224/16227; H01L 2224/16238; H01L 2224/43825; H01L 2224/45139; H01L 2224/45144; H01L 2224/45147; H01L 2224/45664; H01L 2224/48105; H01L 2224/48145; H01L 2224/81193; H01L 2224/8121; H01L 2224/81815; H01L 2224/81951; H01L 2224/95; H01L 2225/06506; H01L 2225/06517; H01L 2225/06562; H01L 24/49; H01L 24/08; H01L 23/3128; H01L 2221/68359; H01L 2225/0651; H01L 21/6835; H01L 25/50; H01L 21/563; H01L 2221/68327; H01L 23/5386; H01L 21/76895

See application file for complete search history.

(56) References Cited

U.S. PATENT DOCUMENTS

| | | | | |
|---|---|---|---|---|
| 10,008,469 | B2 * | 6/2018 | Katkar | ................ H01L 25/0657 |
| 10,008,477 | B2 * | 6/2018 | Haba | .................. H01L 23/3171 |
| 10,276,545 | B1 | 4/2019 | Huang et al. | |
| 10,299,892 | B2 | 5/2019 | Alyami | |
| 10,332,854 | B2 * | 6/2019 | Katkar | ................ H01L 23/5389 |
| 11,830,845 | B2 * | 11/2023 | Sato | .................. H01L 27/14625 |
| 2014/0021605 | A1 * | 1/2014 | Yu | ..................... H01L 23/49827 |
| | | | | 257/E23.021 |
| 2016/0260680 | A1 | 9/2016 | Sakata et al. | |
| 2021/0098425 | A1 | 4/2021 | Lee et al. | |
| 2021/0398946 | A1 | 12/2021 | Maeda et al. | |
| 2022/0013477 | A1 | 1/2022 | Homma et al. | |

FOREIGN PATENT DOCUMENTS

| | | |
|---|---|---|
| TW | 201743420 A | 12/2017 |
| TW | 201943039 A | 11/2019 |
| TW | 202203393 A | 1/2022 |

\* cited by examiner

```
┌─────────────────────────────────────────────────────────────────┐
│ STEP OF FORMING COLUMNAR WIRING EXTENDING IN DIRECTION PERPENDICULAR │
│      TO SURFACE OF FIRST SEMICONDUCTOR ELEMENT (S01)            │
└─────────────────────────────────────────────────────────────────┘
                                │
┌─────────────────────────────────────────────────────────────────┐
│  STEP OF SEALING FIRST SEMICONDUCTOR ELEMENT WHERE COLUMNAR     │
│      WIRING IS FORMED WITH FIRST INSULATING RESIN (S02)         │
└─────────────────────────────────────────────────────────────────┘
                                │
┌─────────────────────────────────────────────────────────────────┐
│         STEP OF EXPOSING TIP END OF COLUMNAR WIRING (S03)       │
└─────────────────────────────────────────────────────────────────┘
                                │
┌─────────────────────────────────────────────────────────────────┐
│         STEP OF ETCHING TIP END OF COLUMNAR WIRING (S07)        │
└─────────────────────────────────────────────────────────────────┘
                                │
┌─────────────────────────────────────────────────────────────────┐
│   STEP OF ELECTROLESS PLATING EXPOSED TIP END OF COLUMNAR       │
│        WIRING TO FORM FIRST HEAD PORTION (S04)                  │
└─────────────────────────────────────────────────────────────────┘
                                │
┌─────────────────────────────────────────────────────────────────┐
│        STEP OF THINNING FIRST INSULATING RESIN ON SIDE          │
│        ON WHICH FIRST HEAD PORTION IS FORMED (S05)              │
└─────────────────────────────────────────────────────────────────┘
                                │
┌─────────────────────────────────────────────────────────────────┐
│ STEP OF ELECTRICALLY CONNECTING FIRST CONDUCTIVE BONDING AGENT  │
│ OF WIRING SUBSTRATE ON WHICH FIRST CONDUCTIVE BONDING AGENT IS FORMED │
│ AND FIRST HEAD PORTION OF MEMBER WHERE FIRST HEAD PORTION IS EXPOSED (S06) │
└─────────────────────────────────────────────────────────────────┘
```

Fig. 16

SEMICONDUCTOR DEVICE AND MANUFACTURING METHOD

CROSS-REFERENCE TO RELATED APPLICATION

This application is based upon and claims the benefit of priority from Japanese Patent Application No. 2022-47566, filed on Mar. 23, 2022, the entire contents of which are incorporated herein by reference.

FIELD

Embodiments described herein relate generally to a semiconductor device and a manufacturing method.

BACKGROUND

In a package in which conventional NAND flash memory chips are stacked, the stacked NAND flash memory chips are connected by bonding. In addition to this structure, a form in which perpendicular wiring is formed from the NAND flash memory chip toward the wiring substrate, the NAND flash memory chip is formed into a flip chip, and the tip end portion of the perpendicular wiring and the wiring substrate are bonded by solder has also been studied.

BRIEF DESCRIPTION OF THE DRAWINGS

FIG. 16 is a flowchart of a method for manufacturing a semiconductor device according to an embodiment;

DETAILED DESCRIPTION

Figure 1:
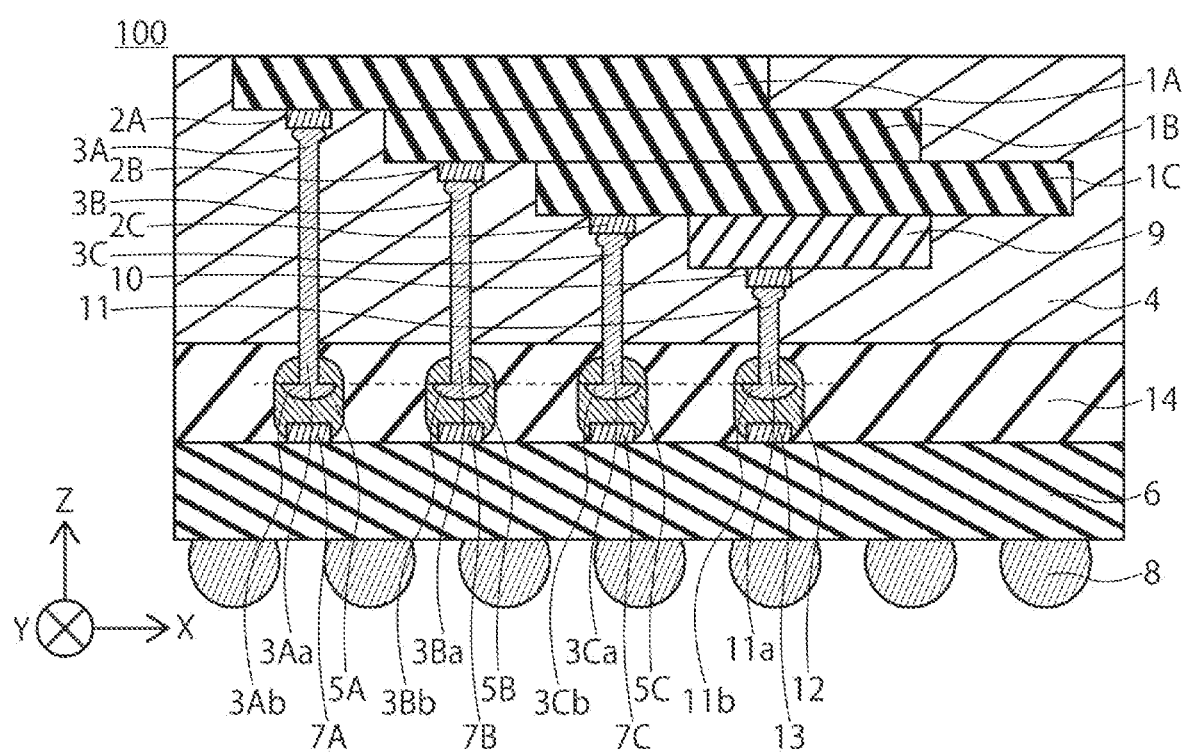
FIG. 1 is a schematic cross-sectional view of the semiconductor device according to the embodiment.

A semiconductor device of an embodiment includes: a first semiconductor element; a first insulating resin that seals the first semiconductor element; a wiring substrate having a pad; a first wiring that extends from the first semiconductor element toward the wiring substrate, and has a first head portion and a first column portion, the first column portion connected to the first semiconductor element and the first head portion exposed on a surface of the first insulating resin; and a first conductive bonding agent that electrically connects the first head portion of the first wiring and the pad. When a surface of the first head portion facing a side of the first insulating resin is defined as a first surface. A surface of the first insulating resin on a side of the wiring substrate is defined as a second surface. A distance from a surface of the wiring substrate on a side of the first insulating resin to the first surface is defined as a first distance, and a distance from a surface of the wiring substrate on the side of the first insulating resin to the second surface is defined as a second distance. The first distance is shorter than the second distance.

Hereinafter, embodiments will be described with reference to the drawings.

In this specification, several elements are given a plurality of expression examples. These expression examples are merely examples, and do not deny that the above-described elements are expressed by other expressions. An element to which a plurality of expressions are not given may also be expressed by another expression.

The drawings are schematic, and a relationship between a thickness and a plane dimension, a ratio between thicknesses of layers, and the like may be different from actual relationship and ratios. In addition, the drawings may include portions having different dimensional relationships and ratios. In the drawings, some reference numerals are omitted.

In the specification, physical characteristic values described in the embodiments are values at atmospheric pressure and 25° C. In addition, values of diameters are values of circumscribed circle diameters.

In this specification, steps include not only independent steps but also other steps and combinations with other treatments. In numerical conditions in this specification, when a plurality of numerical ranges are described, an upper limit value or a lower limit value of the numerical range may be remounted with an upper limit value or a lower limit value of another numerical range. When the upper limit value and the lower limit value of the numerical condition in this specification are described, the numerical condition may be remounted with a condition of a numerical range in which the upper limit value and the lower limit value are combined.

First Embodiment

A first embodiment relates to a semiconductor device and a manufacturing method. FIG. 1 is a schematic cross-sectional view of a semiconductor device 100. More specifically, the semiconductor device 100 of the embodiment is a semiconductor package on which a NAND flash memory chip or the like is mounted. The X direction, the Y direction, and the Z direction preferably cross each other and are orthogonal to each other.

The semiconductor device 100 is an example of a storage device. The semiconductor device 100 includes a first semiconductor element 1A, a second semiconductor element 9, a third semiconductor element 1B, a fourth semiconductor element 1C, a first pad 2A, a third pad 10, a fifth pad 2B, a seventh pad 2C, a first wiring 3A, a second wiring 11, a third wiring 3B, a fourth wiring 3C, a first insulating resin 4, a first conductive bonding agent 5A, a second conductive bonding agent 12, a third conductive bonding agent 5B, a fourth conductive bonding agent 5C, a wiring substrate 6, a second pad 7A, a fourth pad 13, a sixth pad 7B, an eighth pad 7C, a solder ball 8, and a second insulating resin 14. The first conductive bonding agent 5A, the second conductive bonding agent 12, the third conductive bonding agent 5B, and the fourth conductive bonding agent 5C are, for example, solder using a tin alloy.

The first semiconductor element 1A is, for example, a semiconductor memory chip. The first semiconductor element 1A is covered with the first insulating resin 4. The first semiconductor element 1A is electrically connected to wiring substrate 6 via the first wiring 3A.

The first semiconductor element 1A includes the first pad 2A. The first semiconductor element 1A specifically includes the plurality of first pad 2A. The first pad 2A includes a signal pad and a power supply pad. The first pad 2A is provided on the surface of the first semiconductor element 1A facing the side of the wiring substrate 6.

The first pad 2A and the second pad 7A of the wiring substrate 6 are electrically connected via the first wiring 3A. The first wiring 3A includes a first column portion 3Aa and a first head portion 3Ab. The first column portion 3Aa and the first head portion 3Ab are electrically and directly connected.

The first wiring 3A extends from the first semiconductor element 1A toward the wiring substrate 6. The first wiring 3A has a Cu linear conductor portion or a Cu linear conductor portion coated with Pd and a plated portion. The boundary between the conductor portion and the plated portion is located between 0 [μm] or more and 5 [μm] or less, between 0.1 [μm] or more and 5 [μm] or less, or between 1 [μm] or more and 5 [μm] or less on the side of the first semiconductor element 1A from the boundary between the first column portion 3Aa and the first head portion 3Ab. Alternatively, the boundary between the conductor portion and the plated portion is located at the same position as the boundary between the first column portion 3Aa and the first head portion 3Ab. The Cu linear conductor portion or the Cu linear conductor portion coated with Pd is included in the first column portion 3Aa. The plated portion is included in the first head portion 3Ab or a part of the first head portion 3Ab and the first column portion 3Aa on the side of the first head portion 3Ab.

The first conductive bonding agent 5A is provided between the first wiring 3A and the second pad 7A. The first wiring 3A and the second pad 7A are electrically connected via the first conductive bonding agent 5A. The surface of the first conductive bonding agent 5A on the side of the first semiconductor element 1A and the surface of the first head portion 3Ab on the side of the wiring substrate 6 are electrically and directly in contact with each other. The surface of the first conductive bonding agent 5A on the side of the second pad 7A and the surface of the second pad 7A on the side of the first semiconductor element 1A are electrically and directly in contact with each other.

In a case where the first semiconductor element 1A has the plurality of first pads 2A, the semiconductor device 100 includes the plurality of first wirings 3A. In a case where the plurality of first wirings 3A is included, the plurality of second pads 7A is included, and the first semiconductor element 1A and the wiring substrate 6 are electrically connected by the plurality of first wirings 3A.

The first semiconductor element 1A is electrically connected to the second semiconductor element 9, the third semiconductor element 1B, and the fourth semiconductor element 1C via the wiring substrate 6.

The semiconductor memory chip is a semiconductor chip that reads and writes data. As the nonvolatile memory chip, a NAND memory chip, a phase change memory chip, a resistance change memory chip, a ferroelectric memory chip, a magnetic memory chip, or the like can be used. As the volatile memory chip, a dynamic random access memory (DRAM) or the like can be used.

The second semiconductor element 9 is a semiconductor element different from first semiconductor element 1A. The second semiconductor element 9 is, for example, a logic IC chip. In the first embodiment, the second semiconductor element 9 is covered with the first insulating resin 4. When the semiconductor device 100 is a storage device, for example, the first semiconductor element 1A is a semiconductor memory chip, and the second semiconductor element 9 is a controller chip. The controller chip is a semiconductor chip that controls reading, writing, erasing, or the like of the semiconductor memory chip.

The second semiconductor element 9 has the third pad 10. The second semiconductor element 9 is electrically connected to wiring substrate 6 via the second wiring 11. The second semiconductor element 9 has the third pad 10. The third pad 10 is electrically connected to the fourth pad 13 of the wiring substrate 6 via the fourth wiring 3C.

The second semiconductor element 9 has the third pad 10. The second semiconductor element 9 specifically includes the plurality of third pad 10. The third pad 10 includes a signal pad and a power supply pad. The third pad 10 is provided on the surface of the second semiconductor element 9 facing the side of the wiring substrate 6.

The third pad 10 is electrically connected to the fourth pad 13 of the wiring substrate 6 via the second wiring 11. The second wiring 11 includes a second column portion 11a and a second head portion 11b. The second column portion 11a and the second head portion 11b are electrically and directly connected.

The second wiring 11 extends from the second semiconductor element 9 toward the wiring substrate 6. The second wiring 11 has a Cu linear conductor portion or a Cu linear conductor portion coated with Pd and a plated portion. The boundary between the conductor portion and the plated portion is located between 0 [μm] or more and 5 [μm] or less, between 0.1 [μm] or more and 5 [μm] or less, or between 1 [μm] or more and 5 [μm] or less on the side of the second semiconductor element 9 from the boundary between the second column portion 11a and the second head portion 11b. Alternatively, the boundary between the conductor portion and the plated portion is located at the same position as the boundary between the second column portion 11a and the second head portion 11b. The Cu linear conductor portion or the Cu linear conductor portion coated with Pd is included in the second column portion 11a. The plated portion is included in the second head portion 11b or a part of the second head portion 11b and the second column portion 11a on the side of the second head portion 11b.

The second conductive bonding agent 12 is provided between the second wiring 11 and the fourth pad 13. The second wiring 11 and the fourth pad 13 are electrically connected via the second conductive bonding agent 12. The surface of the second conductive bonding agent 12 on the side of the second semiconductor element 9 and the surface of the second head portion 11b on the side of the wiring substrate 6 are electrically and directly in contact with each other. The surface of the second conductive bonding agent 12 on the side of the fourth pad 13 and the surface of the fourth pad 13 on the side of the second semiconductor element 9 are electrically and directly in contact with each other.

In a case where the second semiconductor element 9 has the plurality of third pads 10, the semiconductor device 100 includes the plurality of second wirings 11. In a case where the plurality of second wirings 11 is included, the plurality of fourth pads 13 is included, and the second semiconductor element 9 and the wiring substrate 6 are electrically connected by the plurality of second wirings 11.

The second semiconductor element 9 is electrically connected to the first semiconductor element 1A, the third semiconductor element 1B, and the fourth semiconductor element 1C via the wiring substrate 6.

The third semiconductor element 1B is, for example, a semiconductor memory chip. The third semiconductor element 1B is covered with the first insulating resin 4. Preferably, an adhesive layer is provided between the first semiconductor element 1A and the third semiconductor element 1B, and the first semiconductor element 1A and the third semiconductor element 1B are adhered to each other by the adhesive layer. The third semiconductor element 1B is electrically connected to wiring substrate 6 via the third wiring 3B.

The third semiconductor element 1B has the fifth pad 2B. The third semiconductor element 1B specifically includes the plurality of fifth pad 2B. The fifth pad 2B includes a signal pad and a power supply pad. The fifth pad 2B is provided on the surface of the third semiconductor element 1B facing the side of the wiring substrate 6.

The fifth pad 2B is electrically connected to the sixth pad 7B of the wiring substrate 6 via the third wiring 3B. The third wiring 3B includes a third column portion 3Ba and a third head portion 3Bb. The third column portion 3Ba and the third head portion 3Bb are electrically and directly connected.

The third wiring 3B extends from the third semiconductor element 1B toward the wiring substrate 6. The third wiring 3B has a Cu linear conductor portion or a Cu linear conductor portion coated with Pd and a plated portion. The boundary between the conductor portion and the plated portion is located between 0 [μm] or more and 5 [μm] or less, between 0.1 [μm] or more and 5 [μm] or less, or between 1 [μm] or more and 5 [μm] or less on the side of the third semiconductor element 1B from the boundary between the third column portion 3Ba and the third head portion 3Bb. Alternatively, the boundary between the conductor portion and the plated portion is located at the same position as the boundary between the third column portion 3Ba and the third head portion 3Bb. The Cu linear conductor portion or the Cu linear conductor portion coated with Pd is included in the third column portion 3Ba. The plated portion is included in the third head portion 3Bb or a part of the third head portion 3Bb and the third column portion 3Ba on the side of the third head portion 3Bb.

The third conductive bonding agent 5B is provided between the third wiring 3B and the sixth pad 7B. The third wiring 3B and the sixth pad 7B are electrically connected via the third conductive bonding agent 5B. The surface of the third conductive bonding agent 5B on the side of the third semiconductor element 1B and the surface of the third head portion 3Bb on the side of the wiring substrate 6 are electrically and directly in contact with each other. The surface of the third conductive bonding agent 5B on the side of the sixth pad 7B and the surface of the sixth pad 7B on the side of the third semiconductor element 1B are electrically and directly in contact with each other.

In a case where the third semiconductor element 1B has the plurality of fifth pads 2B, the semiconductor device 100 includes the plurality of third wirings 3B. In a case where the plurality of third wirings 3B is included, the plurality of sixth pads 7B is included, and the third semiconductor element 1B and the wiring substrate 6 are electrically connected by the plurality of third wirings 3B.

The third semiconductor element 1B is electrically connected to the first semiconductor element 1A, the second semiconductor element 9, and the fourth semiconductor element 1C via the wiring substrate 6.

The fourth semiconductor element 1C is, for example, a semiconductor memory chip. The fourth semiconductor element 1C is covered with the first insulating resin 4. Preferably, an adhesive layer is provided between the third semiconductor element 1B and the fourth semiconductor element 1C, and the third semiconductor element 1B and the fourth semiconductor element 1C are adhered to each other by the adhesive layer. The fourth semiconductor element 1C is electrically connected to wiring substrate 6 via the fourth wiring 3C.

The fourth semiconductor element 1C has the seventh pad 2C. The fourth semiconductor element 1C specifically includes the plurality of seventh pad 2C. The seventh pad 2C includes a signal pad and a power supply pad. The seventh pad 2C is provided on the surface of the fourth semiconductor element 1C facing the side of the wiring substrate 6.

The seventh pad 2C is electrically connected to the eighth pad 7C of the wiring substrate 6 via the fourth wiring 3C. The fourth wiring 3C includes a fourth column portion 3Ca and a fourth head portion 3Cb. The fourth column portion 3Ca and the fourth head portion 3Cb are electrically and directly connected.

The fourth wiring 3C extends from the fourth semiconductor element 1C toward the wiring substrate 6. The fourth wiring 3C has a Cu linear conductor portion or a Cu linear conductor portion coated with Pd and a plated portion. The boundary between the conductor portion and the plated portion is located between 0 [µm] or more and 5 [µm] or less, between 0.1 [µm] or more and 5 [µm] or less, or between 1 [µm] or more and 5 [µm] or less on the side of the fourth semiconductor element 1C from the boundary between the fourth column portion 3Ca and the fourth head portion 3Cb. Alternatively, the boundary between the conductor portion and the plated portion is located at the same position as the boundary between the fourth column portion 3Ca and the fourth head portion 3Cb. The Cu linear conductor portion or the Cu linear conductor portion coated with Pd is included in the fourth column portion 3Ca. The plated portion is included in the fourth head portion 3Cb or a part of the fourth head portion 3Cb and the fourth column portion 3Ca on the side of the fourth head portion 3Cb.

The fourth conductive bonding agent 5C is provided between the fourth wiring 3C and the eighth pad 7C. The fourth wiring 3C and the eighth pad 7C are electrically connected via the fourth conductive bonding agent 5C. The surface of the fourth conductive bonding agent 5C on the side of the fourth semiconductor element 1C and the surface of the fourth head portion 3Cb on the side of the wiring substrate 6 are electrically and directly in contact with each other. The surface of the fourth conductive bonding agent 5C on the side of the eighth pad 7C and the surface of the eighth pad 7C on the side of the fourth semiconductor element 1C are electrically and directly in contact with each other.

In a case where the fourth semiconductor element 1C has the plurality of seventh pads 2C, the semiconductor device 100 includes the plurality of fourth wirings 3C. In a case where the plurality of fourth wirings 3C is included, the plurality of eighth pads 7C is included, and the fourth semiconductor element 1C and the wiring substrate 6 are electrically connected by the plurality of fourth wirings 3C.

The semiconductor memory chips included in the semiconductor device 100 such as the first semiconductor element 1A, the third semiconductor element 1B, and the fourth semiconductor element 1C are preferably semiconductor chips having the same circuit and the same structure except for individual differences. In addition, in the present embodiment, a nonvolatile memory chip or a volatile memory chip can be used as the semiconductor memory chip. The number of stages in which the semiconductor memory chips are stacked while being shifted in the X direction can be not only three as illustrated in FIG. 1, but also only one stage, two stages, or four or more stages.

The fourth semiconductor element 1C is electrically connected to the first semiconductor element 1A, the second semiconductor element 9, and the third semiconductor element 1B via the wiring substrate 6.

The wiring that directly connects the semiconductor elements (in the first embodiment, the first semiconductor element 1A, the second semiconductor element 9, the third semiconductor element 1B, and the fourth semiconductor element 1C are used) sealed with the first insulating resin 4 is not included.

A rewiring layer or the like for connecting semiconductor elements (in the first embodiment, the first semiconductor element 1A, the second semiconductor element 9, the third semiconductor element 1B, and the fourth semiconductor element 1C are used) sealed with the first insulating resin 4 may not exist in the first insulating resin 4. That is, in the present embodiment, all the wirings connected to the semiconductor element sealed with the first insulating resin 4 are connected to the wiring substrate 6, but are not connected in the first insulating resin 4. Apart from the above configuration, a configuration including a bonding wire that connects semiconductor elements (in the first embodiment, the first semiconductor element 1A, the second semiconductor element 9, the third semiconductor element 1B, and the fourth semiconductor element 1C are used) sealed with the first insulating resin 4 is also included in the embodiment.

The first pad 2A, the third pad 10, the fifth pad 2B, the seventh pad 2C, the second pad 7A, the fourth pad 13, the sixth pad 7B, and the eighth pad 7C are, for example, electrode pads. The electrode pad is a low-resistance metal film including a film of Cu, Ni, W, Au, Ag, Pd, Sn, Bi, Zn, Cr, Al, Ti, Ni—P, Ni—B, or the like, or a film containing two or more selected from the group including Cu, Ni, W, Au, Ag, Pd, Sn, Bi, Zn, Cr, Al, Ti, Ni—P, and Ni—B. More specifically, the electrode pad is more preferably Al, Al—Cu, Ni/Pd/Au, Ni/Au, or Cu.

The first insulating resin 4 has an insulating property and contains a resin. The first insulating resin 4 contains one or more selected from the group including an epoxy-based resin, a phenol-based resin, a polyimide-based resin, a polyamide-based resin, an acryl-based resin, a polybenzoxazole-based resin, a silicone-based resin, and a benzocyclobutene-based resin. Examples of the epoxy-based resin are not particularly limited, and include bisphenol-type epoxy resins such as bisphenol A type, bisphenol F type, bisphenol AD type, and bisphenol S type; novolac-type epoxy resins such as phenol novolac type and cresol novolac type; aromatic epoxy resins such as resorcinol type epoxy resins and trisphenol methane triglycidyl ether; naphthalene-type epoxy resins; fluorene-type epoxy resins; dicyclopentadiene-type epoxy resins; polyether-modified epoxy resins; benzophenone-type epoxy resins; aniline-type epoxy resins; NBR-modified epoxy resins; CTBN-modified epoxy resins; and hydrogenated products of these. Among them, naphthalene-type epoxy resins and dicyclopentadiene-type epoxy resins are preferable from the viewpoint of good adhesion to Si. In addition, benzophenone-type epoxy resins are also preferable because rapid curability is easily obtained. These epoxy resins may be used alone or in combination of two or more kinds of them. In addition, the first insulating resin 4 may contain an insulating filler such as silica or alumina.

The first conductive bonding agent 5A, the second conductive bonding agent 12, the third conductive bonding agent 5B, and the fourth conductive bonding agent 5C are bonding members such as solder. The first conductive bonding agent 5A, the second conductive bonding agent 12, the third conductive bonding agent 5B, and the fourth conductive bonding agent 5C are preferably any of a composite film containing two or more of one simple substance selected from the group including Sn, Ag, Cu, Au, Pd, Bi, Zn, Ni, Sb, In, and Ge, one simple substance selected from the group including Sn, Ag, Cu, Au, Pd, Bi, Zn, Ni, Sb, In, and Ge, or an alloy containing two or more kinds selected from the group including Sn, Ag, Cu, Au, Pd, Bi, Zn, Ni, Sb, In, and Ge.

The wiring substrate 6 is a multilayer wiring substrate. A member in which the first semiconductor element 1A or the like are sealed with the first insulating resin 4 is provided on the wiring substrate 6. A hemispherical electrode such as the solder ball 8 for connecting to the outside of the semiconductor device 100 is provided on the surface side of the wiring substrate 6 opposite to the surface on which a member sealed with the first insulating resin 4 is provided.

Preferably, the second insulating resin 14 is provided between the first insulating resin 4 and the wiring substrate 6. The second insulating resin 14 has an insulating property and contains a resin. The second insulating resin 14 contains one or more selected from the group including an epoxy-based resin, a phenol-based resin, a polyimide-based resin, a polyamide-based resin, an acryl-based resin, a polybenzoxazole-based resin, a silicone-based resin, and a benzocyclobutene-based resin. Examples of the epoxy-based resin are not particularly limited, and include bisphenol-type epoxy resins such as bisphenol A type, bisphenol F type, bisphenol AD type, and bisphenol S type; novolac-type epoxy resins such as phenol novolac type and cresol novolac type; aromatic epoxy resins such as resorcinol type epoxy resins and trisphenol methane triglycidyl ether; naphthalene-type epoxy resins; fluorene-type epoxy resins; dicyclopentadiene-type epoxy resins; polyether-modified epoxy resins; benzophenone-type epoxy resins; aniline-type epoxy resins; NBR-modified epoxy resins; CTBN-modified epoxy resins; and hydrogenated products of these. Among them, naphthalene-type epoxy resins and dicyclopentadiene-type epoxy resins are preferable from the viewpoint of good adhesion to Si. In addition, benzophenone-type epoxy resins are also preferable because rapid curability is easily obtained. These epoxy resins may be used alone or in combination of two or more kinds of them. In addition, the second insulating resin 14 may contain an insulating filler such as silica or alumina. In addition, the resin to be the second insulating resin 14 after curing may contain alcohols and/or organic acids. The resin to be the second insulating resin 14 after curing is a curable insulating resin used for flip chip mounting as an underfill agent. The alcohols and/or organic acids contained in the resin that becomes the second insulating resin 14 after curing preferably has a flux function of removing the oxide film on the surface of the first wiring 3A. Examples of the alcohols contained in the resin to be the second insulating resin 14 after curing include at least one selected from methanol, ethanol, isopropyl alcohol, polyvinyl alcohol, ethylene glycol, propylene glycol, diethylene glycol, glycerin, triethylene glycol, tetraethylene glycol, carbitol, cellosolve alcohol, or the like. In addition, an alkyl ether-based material may be used. Examples include diethylene glycol monobutyl ether and triethylene glycol dimethyl ether. An alkane, an amine compound, or the like can also be used. Examples include formamide and dimethylformamide. These may be used alone or a plurality of substances may be mixed. Examples of the organic acid contained in the resin that becomes the second insulating resin 14 after curing include formic acid, acetic acid, benzoic acid, abietic acid, parastrinic acid, dehydroabietic acid, isopimaric acid, neoabietic acid, pimaric acid, and rosin. The alcohols and/or organic acids may be used alone, or a plurality of alcohols and/or organic acids may be mixed. The resin having a function of removing the oxide film is applied by various methods such as a dispensing method, a printing method, a jet method, and a screw method.

The thermal expansion coefficient of the second insulating resin 14 is preferably larger than those of the first insulating resin 4 and the wiring substrate 6. It is more preferable that the relationship of the thermal expansion coefficient of the second insulating resin 14>the thermal expansion coefficient of the wiring substrate 6>the thermal expansion coefficient of the first insulating resin 4 is satisfied. When the thermal expansion coefficient of the second insulating resin 14 is smaller than the thermal expansion coefficient of the wiring substrate 6, there is a possibility that the elongation of the second insulating resin 14 cannot follow the elongation of the wiring substrate 6 when the member sealing the first semiconductor element 1A or the like is mounted on the wiring substrate 6, and the second insulating resin 14 is peeled off. Therefore, the thermal expansion coefficient of the second insulating resin 14 is preferably in the range of 20 [ppm/° C.] or more to 60 [ppm/° C.], and more preferably 20 [ppm/° C.] or more to 40 [ppmm/° C.]. When the thermal expansion coefficient of the second insulating resin 14 is smaller than 20 [ppm/° C.], the thermal expansion coefficient approaches the thermal expansion coefficient of the wiring substrate 6, and cannot follow the elongation of the wiring substrate 6, and the second insulating resin 14 may be easily peeled off. When the thermal expansion coefficient of the second insulating resin 14 is larger than 60 [ppm/° C.], the third resin may excessively elongated, and the second insulating resin 14 may be easily peeled off. The thermal expansion coefficient of the second insulating resin 14 is preferably 10% or more higher than the thermal expansion coefficient of the wiring substrate 6. The thermal expansion coefficient of the wiring substrate 6 is preferably 10% or more higher than the thermal expansion coefficient of the first insulating resin 4.

The elastic modulus of the second insulating resin 14 is preferably smaller than the elastic modulus of the first insulating resin 4 and the elastic modulus of the wiring substrate 6. More preferably, the relationship of the elastic modulus of the first insulating resin 4>the elastic modulus of the wiring substrate 6>the elastic modulus of the second insulating resin 14 is satisfied. Therefore, the elastic modulus of the second insulating resin 14 is preferably 0.1 [GPa] or more and 20 [GPa] or less, and more preferably 1 [GPa] or more and 15 [GPa] or less. When the elastic modulus of the second insulating resin 14 is less than 0.1 "GPa", it is difficult to fix the member sealing the first semiconductor element 1A by the second insulating resin 14. When the elastic modulus of the second insulating resin 14 exceeds 20 [GPa], the second insulating resin 14 may be easily peeled off from the solder resist of the wiring substrate 6 due to warpage of the second insulating resin 14 and the wiring substrate 6. The elastic modulus of the first insulating resin 4 is preferably 10% or more higher than the elastic modulus of the wiring substrate 6. The elastic modulus of the wiring substrate 6 is preferably 10% or more higher than the elastic modulus of the second insulating resin 14.

Next, a connection portion between a member in which the first semiconductor element 1A or the like are sealed with the first insulating resin 4 and the wiring substrate 6 will be described with reference to a partial schematic view of the semiconductor device 100 illustrated in FIG. 2. Hereinafter, the connection portion of the first wiring 3A will be described. The connection portion of the second wiring 11, the third wiring 3B, and the fourth wiring 3C is the same as the connection portion of the first wiring 3A. With respect to the connection portion of the second wiring 11, the third wiring 3B, and the fourth wiring 3C, the description of contents common to the connection portion of the first wiring 3A will be omitted.

Figure 2:
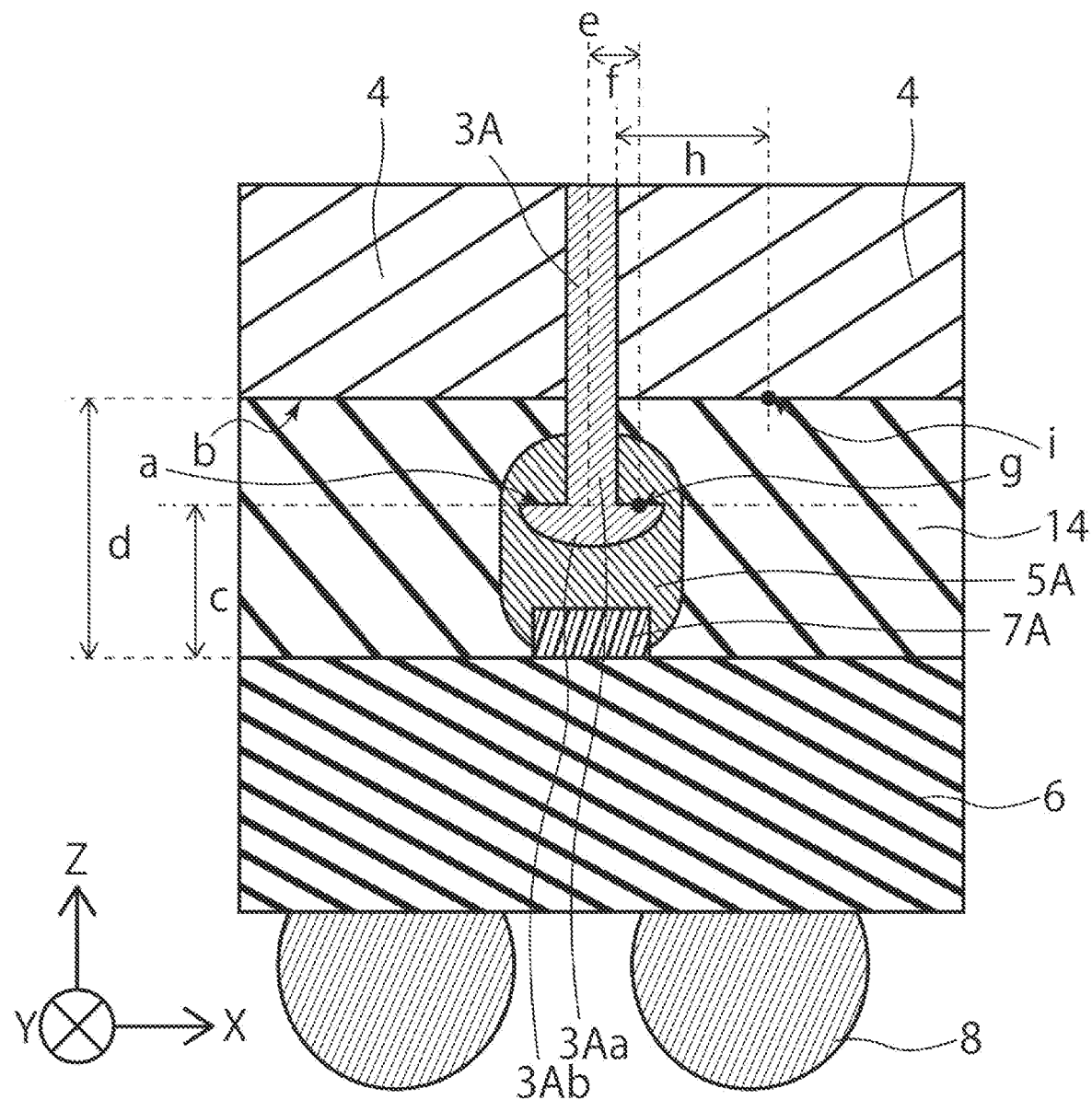
FIG. 2 is a partial schematic view of the semiconductor device according to the embodiment.

FIG. 2 is a schematic view illustrating a connection portion of the first wiring 3A with the wiring substrate 6. FIG. 2 illustrates the first wiring 3A, the first insulating resin 4, the first conductive bonding agent 5A, the second pad 7A, the wiring substrate 6, and the second insulating resin 14. In FIG. 2, an alternate long and short dash line of the first wiring 3A is a boundary between a linear conductor portion and a plated portion. In FIGS. 1 and 2, a portion above the alternate long and short dash line of the first wiring 3A is, for example, a linear conductor portion, and a portion below the alternate long and short dash line is a plated portion.

The diameter of the first column portion 3Aa of the first wiring 3A is preferably 10 [µm] or more to 50 [µm] or less, and preferably 15 [µm] or more to 30 [µm] or less. If the diameter of the first column portion 3Aa is too small, the strength is weak, and there is a possibility that the first column portion 3Aa is deformed when sealing is performed with the first insulating resin 4. In addition, when the diameter of the first column portion 3Aa is too large, there is a problem that the connection portion of the first wiring formed on the pad on the semiconductor element protrudes from the pad. Therefore, the first column portion 3Aa having a diameter in the above range is preferable.

The diameter of the first head portion 3Ab of the first wiring 3A is preferably 15 [µm] or more to 100 [µm] or less, and preferably 20 [µm] or more to 80 [µm] or less. Since the diameter of the first column portion 3Aa is small, it is difficult to directly bond the first column portion 3Aa to the second pad 7A on the side of the wiring substrate 6. When the first column portion 3Aa of the first wiring 3A can be 50 [µm] or more, the tip end portion of the first column portion 3Aa and the second pad 7A can be directly connected via the first conductive bonding agent 5A. However, it is difficult to increase the diameter of the first column portion 3Aa in relation to the pitch of the first pad 2A. Therefore, by providing the first head portion 3Ab on the tip end side of the first wiring 3A, the diameter of the tip end side of the first wiring 3A can be increased to form a good bonding. In addition, when the diameter of the first column portion 3Aa is too large, there is a problem that a short circuit occurs with the adjacent conductive bonding agent in a case where the first column portion 3Aa is connected to the wiring substrate. Therefore, the first column portion 3Aa having a diameter in the above range is preferable.

A surface of the first head portion 3Ab facing the side of the first insulating resin 4 is defined as a first surface a, and a surface of the first insulating resin 4 facing the side of the wiring substrate 6 is defined as a second surface b. At this time, the distance from the surface of the wiring substrate 6 on the side of the first insulating resin 4 to the first surface a is defined as a first distance c. Then, the distance from the surface of the wiring substrate 6 on the side of the first insulating resin 4 to the second surface b is defined as a second distance d. The first distance c is shorter than the second distance d.

The difference between the first distance c and the second distance d is preferably 50 [nm] or more and 5000 [nm] or less, and more preferably 100 [nm] or more and 1000 [nm] or less. When the difference between the first distance c and the second distance d is small, the first conductive bonding agent 5A or the second insulating resin 14 hardly enters between the first surface a and the second surface b, and it is difficult to form a good bonding with the first surface a. If the difference (d−c) between the first distance c and the second distance d is too large, processing becomes difficult, which is not preferable from the viewpoint of economy and yield.

When the first distance c and the second distance d are the same, the first surface a is in contact with (substantially in contact with) the second surface b. The first head portion 3Ab, which is a plated portion of the first wiring 3A, is formed after the first insulating resin 4 is formed. Then, since the plated portion is not bonded to the first insulating resin 4, the first surface a and the second surface b are not joined. In a case where the first surface a and the second surface b are not bonded, when stress is applied in a direction in which the member sealed with the first insulating resin 4 and the wiring substrate 6 are separated from each other, the linear conductor portion and the plated portion are easily broken. For example, when a member sealed with the first insulating resin 4 is connected to the wiring substrate 6, the member sealed with the first insulating resin 4 may be broken at the boundary between the first column portion 3Aa and the first head portion 3Ab or the boundary between the linear conductor portion and the plated portion due to the warpage of the member sealed with the first insulating resin 4.

The first distance c, which is the distance from the surface of the wiring substrate 6 on the side of the first insulating resin 4 to the first surface a, is defined as follows. The first surface a of the first head portion 3Ab may not be flat. The first distance c is determined on the same basis in both the case of being flat and the case of not being flat. Therefore, in the cross section as shown in FIG. 2, a distance f1 is [the radius of the first column portion 3Aa]+[5 [µm]], the position of the distance f in the X direction (direction from the first wiring 3A to the third wiring 3b in the cross section of FIG. 2) from a center e of the first head portion 3Ab is a point g, and the first distance c is the distance from the point g in the Z direction (the extending direction of the first wiring 3A) to the wiring substrate 6. In addition, on the second surface b of the first insulating resin 4, a position at a distance h (50[µm]) from a boundary between the first insulating resin 4 and the first wiring 3A in the X direction (direction from the first wiring 3A toward the third wiring 3b in the cross section of FIG. 2 (arrow direction in X of FIG. 1)) is defined as a point i, and the second distance d is a distance from the point i in the Z direction (extending direction of the first wiring 3A) to the wiring substrate 6.

In a thin linear conductor portion where plating is not formed and a head portion is not provided, a good bonding is not directly formed with the first conductive bonding agent 5A, and reliability of a connection portion between the linear conductor portion and the first conductive bonding agent 5A is low. Therefore, by making the first distance c shorter than the second distance d, the first surface a of the first head portion 3Ab is connected to the first conductive bonding agent 5A or the second insulating resin 14, and the reliability of the wiring can be improved.

In the semiconductor device 100 illustrated in the schematic view of FIG. 2, the first surface a of the first head portion 3Ab is in contact with the first conductive bonding agent 5A. Since the first surface a of the first head portion 3Ab is in contact with the first conductive bonding agent 5A, the first surface a of the first head portion 3Ab and the first conductive bonding agent 5A are bonded. Since the surface of the first surface a of the first head portion 3Ab and the first conductive bonding agent 5A are bonded by a hydrogen bond, a covalent bond, or metal diffusion, the first surface a of the first head portion 3Ab and the first conductive bonding agent 5A are in contact (directly in contact) with each other.

Figure 3:
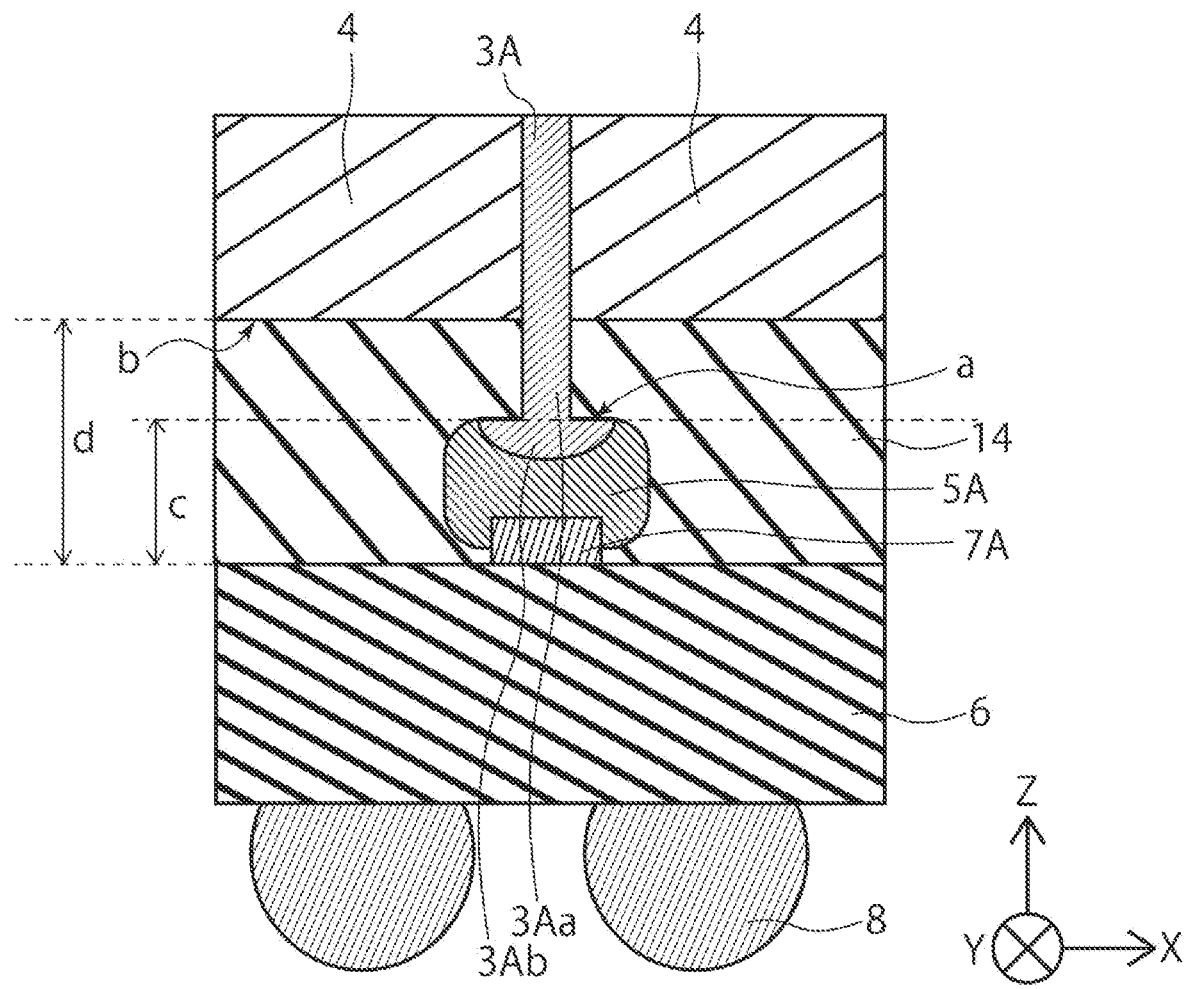
FIG. 3 is a partial schematic view of the semiconductor device according to the embodiment.

FIG. 3 is a schematic view illustrating a connection portion of the first wiring 3A with the wiring substrate 6. The schematic view of FIG. 3 is a modification of the schematic view of FIG. 2, and is different from the partial schematic view of FIG. 2 in that the first surface a of the first head portion 3Ab is in contact (directly) with the second insulating resin 14. The first conductive bonding agent 5A exists between the first surface a and the surface of the wiring substrate 6 on the side of the first insulating resin 4. In the form illustrated in the schematic view of FIG. 3, the first surface a of the first head portion 3Ab is in contact with the second insulating resin 14. Thus, the first surface a of the first head portion 3Ab and the second insulating resin 14 are bonded. Since the surface of the first surface a of the first head portion 3Ab and the second insulating resin 14 are bonded by a hydrogen bond or a covalent bond, the first surface a of the first head portion 3Ab and the second insulating resin 14 are in contact (directly in contact) with each other.

Figure 4:
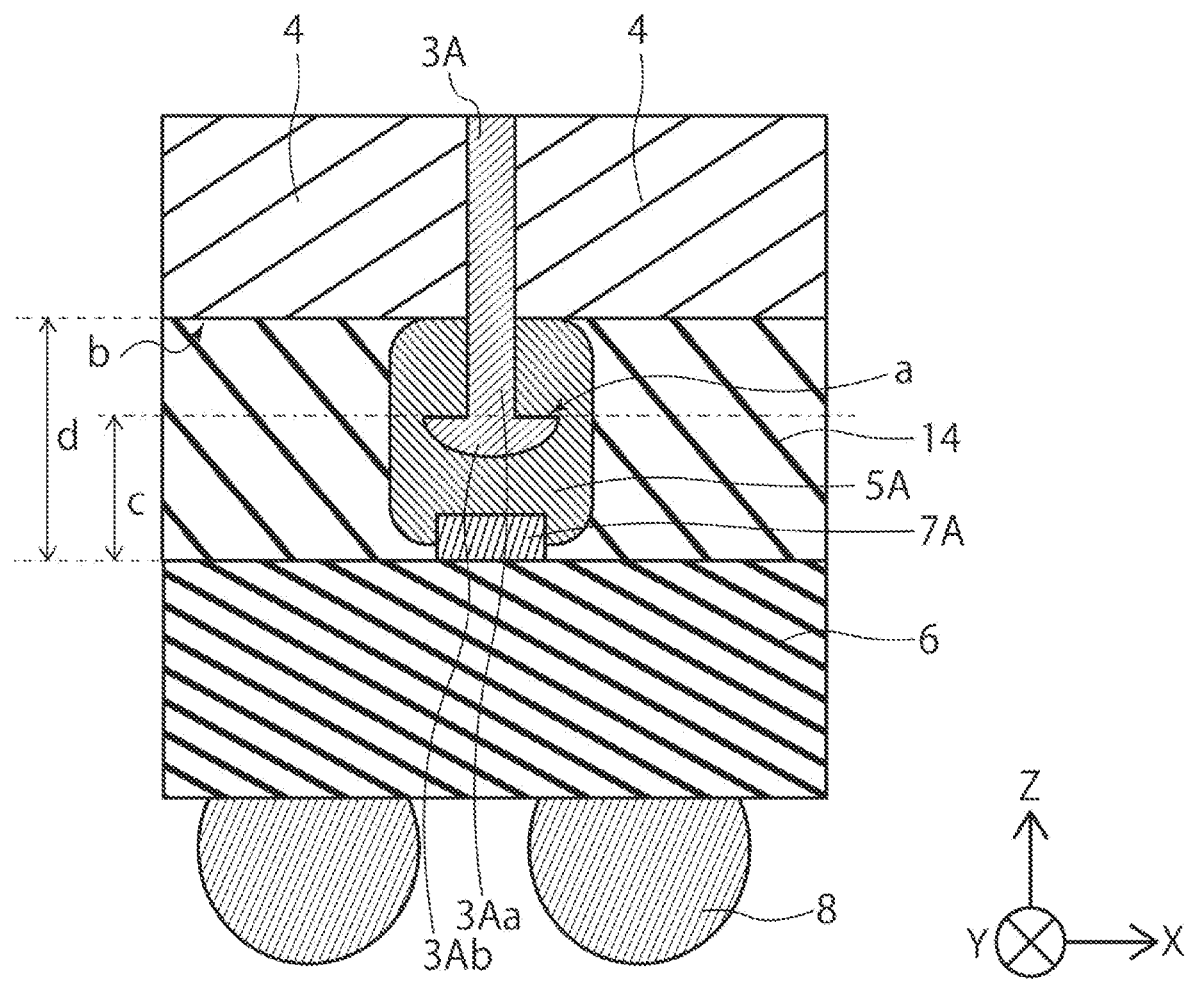
FIG. 4 is a partial schematic view of the semiconductor device according to the embodiment.

FIG. 4 is a schematic view illustrating a connection portion of the first wiring 3A with the wiring substrate 6. The schematic view of FIG. 4 is a modification of the schematic view of FIG. 2, and is different from the partial schematic view of FIG. 2 in that the second surface b is in contact (directly) with the first conductive bonding agent 5A. The first conductive bonding agent 5A exists between the second surface b and the surface of the wiring substrate 6 on the side of the first insulating resin 4. In the form illustrated in the schematic view of FIG. 4, since the first surface a of the first head portion 3Ab is in contact with the first conductive bonding agent 5A, the first surface a of the first head portion 3Ab and the first conductive bonding agent 5A are bonded. Since the surface of the first surface a of the first head portion 3Ab and the first conductive bonding agent 5A are bonded by a hydrogen bond, a covalent bond, or metal diffusion, the first surface a of the first head portion 3Ab and the first conductive bonding agent 5A are in contact (directly in contact) with each other.

The plated portion of the first wiring 3A is formed at the tip end of the linear conductor portion by plating, more specifically, electroless plating. Therefore, the linear conductor portion, which is the metal of the base when the plated portion is formed, and the plated portion are joined. However, since the non-metallic resin portion is not plated, the base resin portion, for example, the surface of the first insulating resin 4 is not plated, and the resin portion and the plated portion are not bonded (joined). Then, since the side of the first surface a of the first head portion 3Ab is not bonded to the base resin portion, the first wiring 3A is easily broken when stress is applied in a direction in which the member sealed with the first insulating resin 4 and the wiring substrate 6 are separated from each other. In the configuration of the embodiment, the side of the first head portion 3Ab of the first head portion 3Ab is in contact with and bonded to the first conductive bonding agent 5A or the second insulating resin 14, and is hardly broken.

Figures 5, 6:
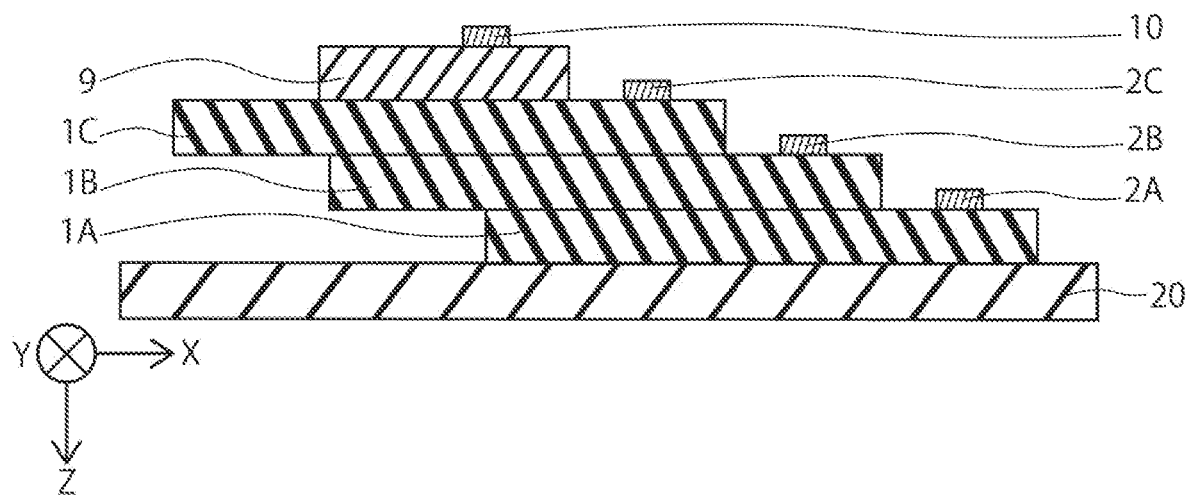
FIG. 5 is a flowchart of a method for manufacturing a semiconductor device according to an embodiment.
FIG. 6 is a process schematic cross-sectional view of the method for manufacturing a semiconductor device according to the embodiment.

Next, a method for manufacturing the semiconductor device 100 will be described. FIG. 5 is a flowchart of the method for manufacturing the semiconductor device 100. FIGS. 6 to 12 are process cross-sectional schematic views of the semiconductor device 100.

A method for manufacturing the semiconductor device 100 includes: a step (S01) of forming the columnar wiring 21 extending in a direction perpendicular to a surface of the first semiconductor element 1A; a step (S02) of sealing the first semiconductor element 1A where the columnar wiring 21 is formed with the first insulating resin 4; a step (S03) of exposing a tip end of the columnar wiring 21; a step (S04) of forming the first head portion 3Ab by electroless plating the tip end of the exposed columnar wiring 21; a step (S05) of thinning the first insulating resin 4 on a side on which the first head portion 3Ab is formed; and a step (S06) of electrically connecting the first conductive bonding agent 5A of the wiring substrate 6 on which the first conductive bonding agent 5A is formed and the first head portion 3Ab of a member where the first head portion 3Ab is exposed.

First, a step (S01) of forming the columnar wiring 21 extending in the direction perpendicular to the surface of the first semiconductor element 1A on the first pad 2A of the first semiconductor element 1A will be described with reference to the process schematic cross-sectional views of FIGS. 6 and 7. The process schematic cross-sectional view of FIG. 6 illustrates a member in which the first semiconductor element 1A, the third semiconductor element 1B, the fourth semiconductor element 1C, and the second semiconductor element 9 are sequentially stacked on a support substrate 20. There is an intermediate layer (not illustrated) between the support substrate 20 and the first semiconductor element 1A, between the first semiconductor element 1A and the third semiconductor element 1B, between the third semiconductor element 1B and the fourth semiconductor element 1C, and between the fourth semiconductor element 1C and the second semiconductor element 9, and it is preferable that these are bonded by the intermediate layer. Although the intermediate layer is not illustrated in the semiconductor device 100 of FIG. 1, it is preferable that the intermediate layer is provided between the first semiconductor element 1A and the third semiconductor element 1B, between the third semiconductor element 1B and the fourth semiconductor element 1C, and between the fourth semiconductor element 1C and the second semiconductor element 9. The intermediate layer may be present on the surface opposite to the side of the first pad 2A, that is, the surface of the member sealed with the first insulating resin 4. The intermediate layer is, for example, an adhesive layer of a die attach film.

Figure 7:
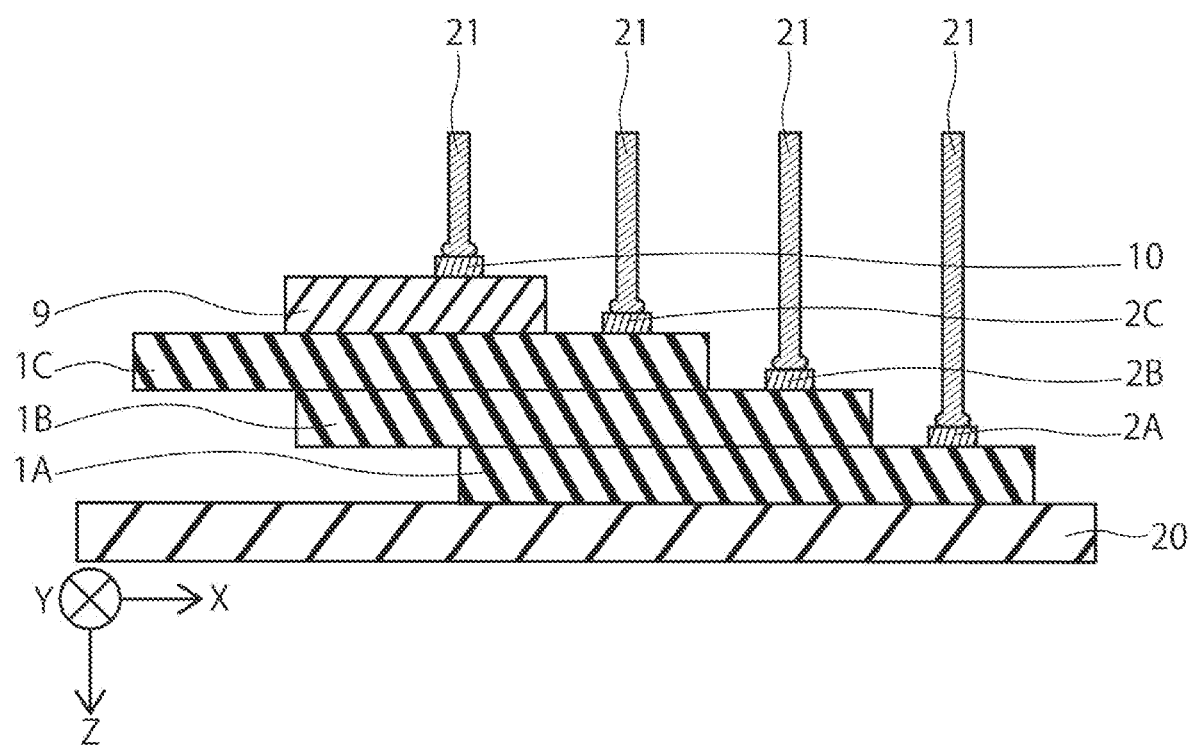
FIG. 7 is a process schematic cross-sectional view of the method for manufacturing a semiconductor device according to the embodiment.

In the process schematic cross-sectional view of FIG. 7, the columnar wiring 21 is formed from each of the first pad 2A, the third pad 10, the fifth pad 2B, and the seventh pad 2C of the member in the process schematic cross-sectional view of FIG. 6. The columnar wiring 21 provided on the first pad 2A of the first semiconductor element 1A extends in a direction perpendicular to the surface of the first semiconductor element 1A. The columnar wiring 21 provided on the third pad 10 of the second semiconductor element 9 extends in a direction perpendicular to the surface of the second semiconductor element 9. The columnar wiring 21 provided on the fifth pad 2B of the third semiconductor element 1B extends in a direction perpendicular to the surface of the third semiconductor element 1B. The columnar wiring 21 provided on the seventh pad 2C of the fourth semiconductor element 1C extends in a direction perpendicular to the surface of the fourth semiconductor element 1C. The direction in which the columnar wiring 21 extends is also the stacking direction of the first semiconductor element 1A, the third semiconductor element 1B, the fourth semiconductor element 1C, and the second semiconductor element 9.

The length of the columnar wiring 21 is preferably set in a manner that the distance from the support substrate 20 is substantially the same as illustrated in the process schematic cross-sectional view of FIG. 7. The variation in the distance from the tip end of the plurality of columnar wirings 21 to the support substrate 20 is preferably small, and the difference between the maximum value and the minimum value of the distance from the tip end of the plurality of columnar wirings 21 to the support substrate 20 is preferably 5 [μm] or more and 50 [μm] or less, and more preferably 0 [μm] or more and less than 5 [μm].

In the columnar wiring 21, for example, the tip end of the capillary is pressed against the first pad 2A to bond the first pad 2A and the wire, and the wire having a length corresponding to the height of the columnar wiring 21 to be formed is fed to press the capillary against a plane or a pad portion. The wire of the pressed portion becomes thin, and the capillary is pulled up without feeding out the wire to cut the wire and form the columnar wiring 21. The columnar wiring 21 of the second semiconductor element 9, the third semiconductor element 1B, and the fourth semiconductor element 1C is similarly formed.

Figure 8:
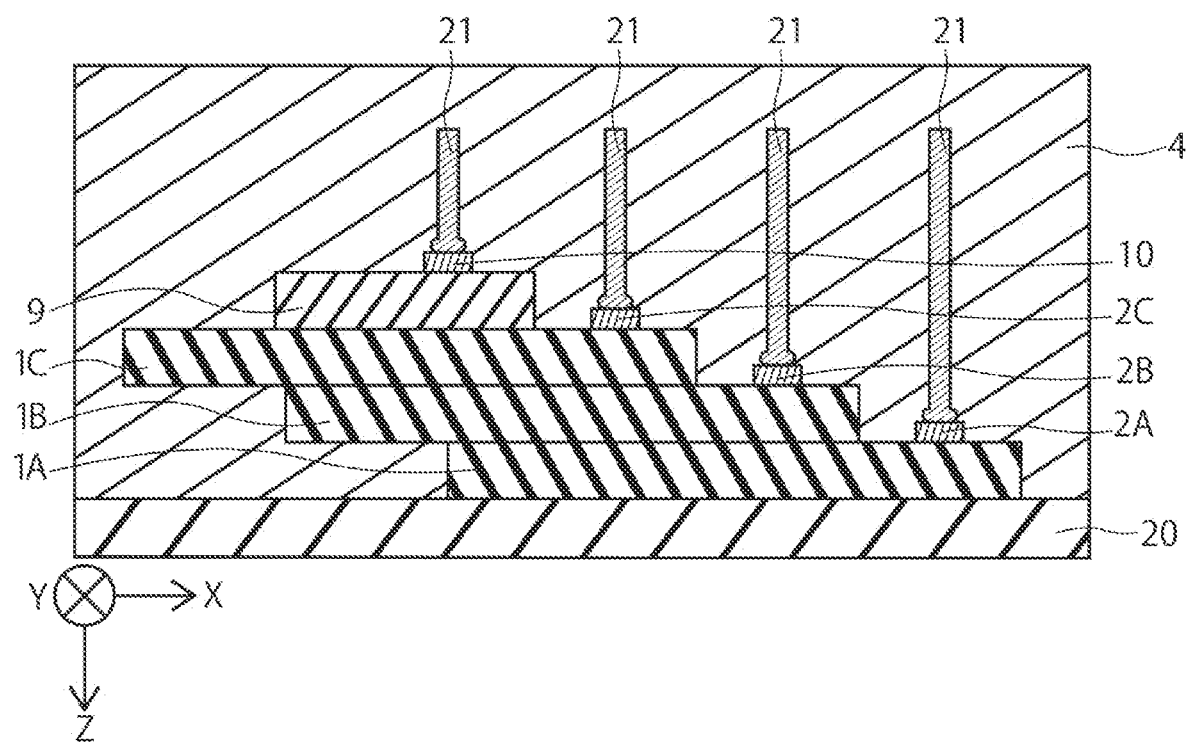
FIG. 8 is a process schematic cross-sectional view of the method for manufacturing a semiconductor device according to the embodiment.

Next, a step (S02) of sealing the first semiconductor element 1A where the columnar wiring 21 is formed with the first insulating resin 4 will be described with reference to a process schematic cross-sectional view of FIG. 8. As shown in the process schematic cross-sectional view of FIG. 8, the first semiconductor element 1A of the member is sealed with the first insulating resin 4 in the process schematic cross-sectional view of FIG. 7. In a case where another semiconductor element (according to the configuration of the first embodiment, the second semiconductor element 9, the third semiconductor element 1B, and the fourth semiconductor element 1C) is stacked on the first semiconductor element 1A as illustrated in the process schematic cross-sectional view of FIG. 8, the stacked body including the first semiconductor element 1A is sealed with the first insulating resin 4. The tip end portion of the columnar wiring 21 is also sealed with the first insulating resin 4 to be covered. It is preferable to remove the support substrate 20 after sealing with the first insulating resin 4. Removal of the support substrate 20 is arbitrary, and may be performed in other steps, or the support substrate 20 may be included in the semiconductor device 100 without removing the support substrate 20. The first insulating resin 4 is cured by heating or UV.

Figure 9:
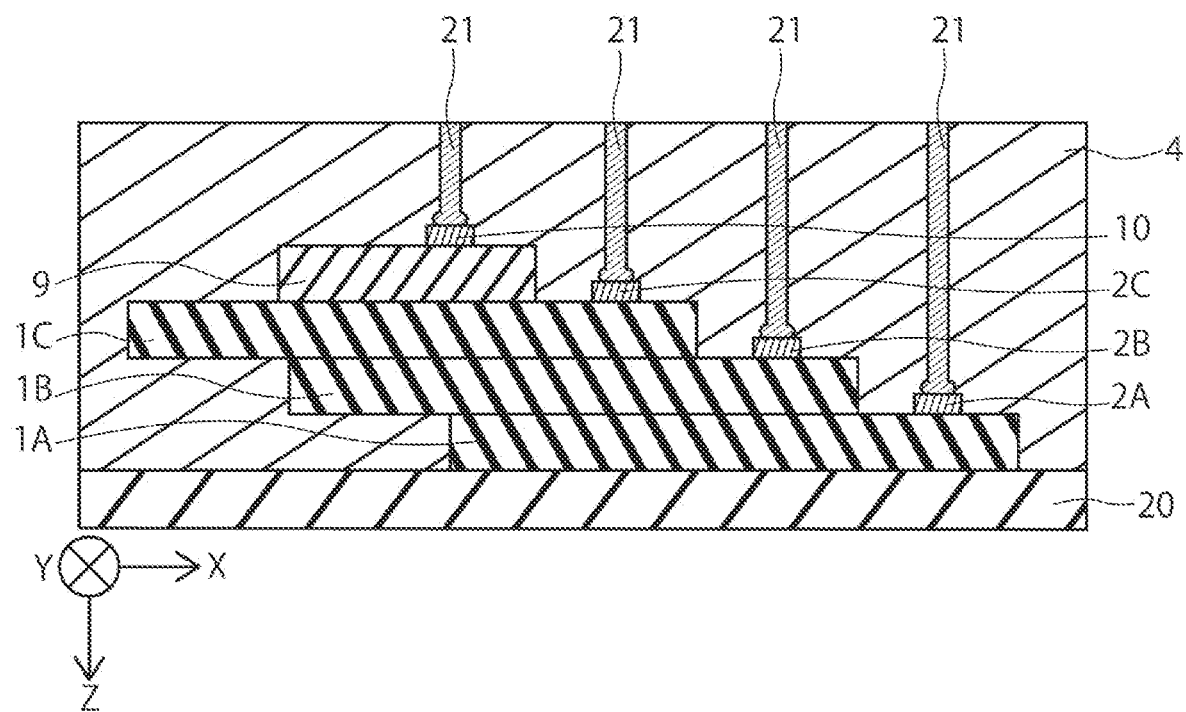
FIG. 9 is a process schematic cross-sectional view of the method for manufacturing a semiconductor device according to the embodiment.

Next, a step (S03) of exposing the tip end of the columnar wiring 21 will be described with reference to the process schematic cross-sectional view of FIG. 9. As illustrated in the process schematic cross-sectional view of FIG. 9, the first insulating resin 4 of the member of FIG. 8 is thinned in a manner that the tip end of the columnar wiring 21 is exposed. For example, the tip end of the columnar wiring 21 is exposed by polishing the surface of the first insulating resin 4 by a mechanical polishing method, a chemical polishing method, chemical mechanical polishing (CMP), or the like. It is possible to align the tip end positions of the columnar wirings 21 at the time of polishing. In the first embodiment, the columnar wiring 21 which is connected to the first semiconductor element 1A and has an exposed tip end is a linear conductor portion of the first wiring 3A and is the first column portion 3Aa.

Figure 10:
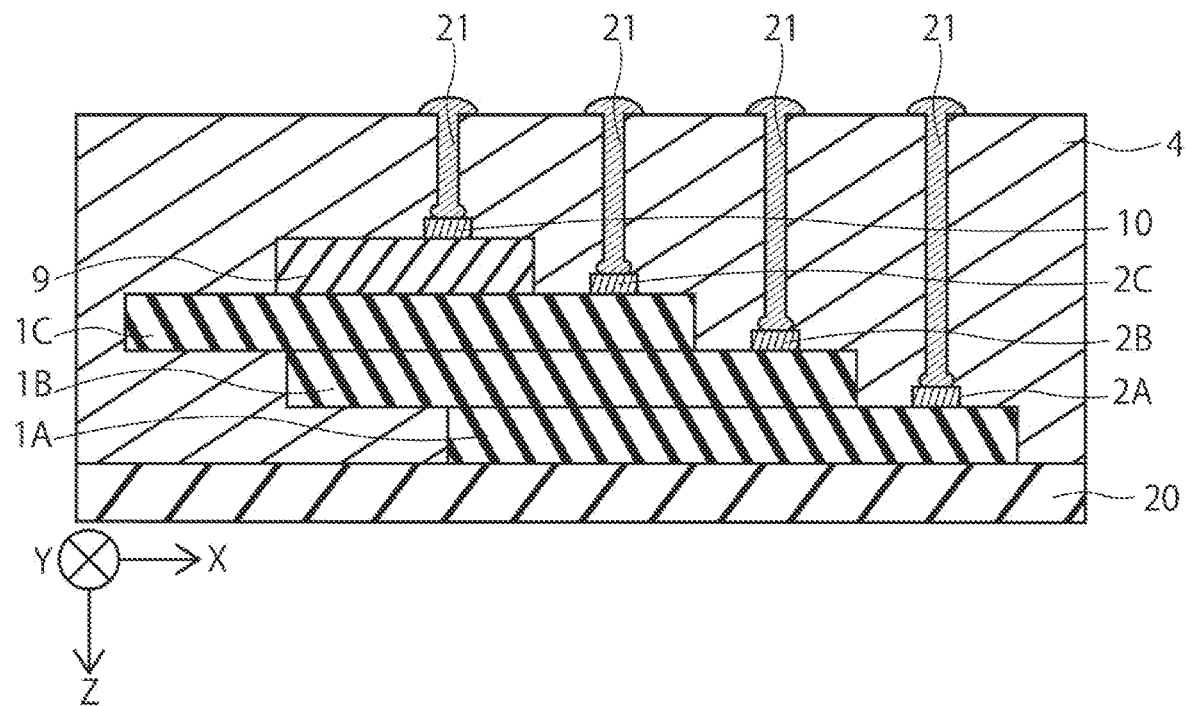
FIG. 10 is a process schematic cross-sectional view of the method for manufacturing a semiconductor device according to the embodiment.

Next, a step (S04) of forming the first head portion 3Ab by electroless plating the exposed tip end of the columnar wiring 21 will be described with reference to the process schematic cross-sectional view of FIG. 10. As shown in the process schematic cross-sectional view of FIG. 10, plating is performed on the exposed portion of the columnar tip end of the member shown in the process schematic cross-sectional view of FIG. 9 to form the first head portion 3Ab. Since the columnar wiring 21 of the first semiconductor element 1A is plated, it is difficult to take out an electrode by electrolytic plating. Therefore, electroless plating is performed. In addition, since the first head portion 3Ab is formed by electroless plating, the first surface a is not in contact with the first insulating resin 4. Although a hemispherical shape is illustrated as the shape of the first head portion 3Ab, the shape is not limited to this, and the tip end of the plated portion may be thicker than the columnar wiring 21 (for example, the circumscribed circle diameter of the first head portion 3Ab may be thicker than the circumscribed circle diameter of the first column portion 3Aa by 10% or more).

Figure 11:
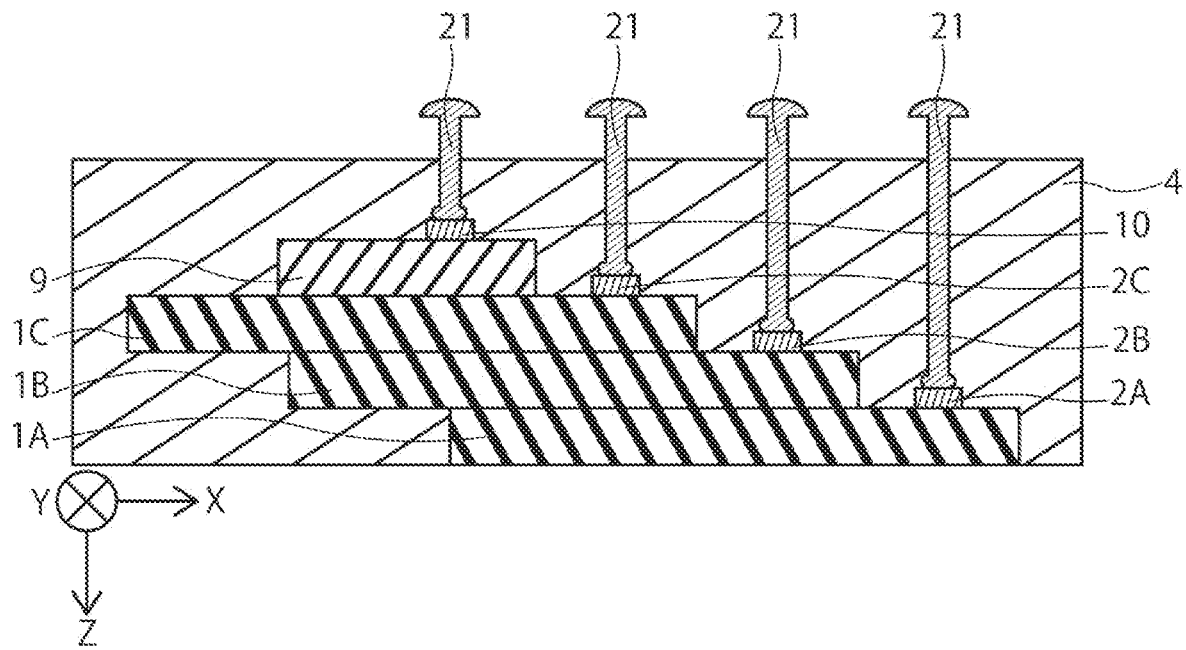
FIG. 11 is a process schematic cross-sectional view of the method for manufacturing a semiconductor device according to the embodiment.

Next, a step (S05) of thinning the first insulating resin 4 on the side on which the first head portion 3Ab is formed will be described with reference to a schematic cross-sectional view of FIG. 11. As shown in the process schematic cross-sectional view of FIG. 11, the surface of the first insulating resin 4 on the side on which the first head portion 3Ab of the member in the process schematic cross-sectional view of FIG. 10 is formed is thinned. Then, a part of the first column portion 3Aa on the side of the first head portion 3Ab is exposed. Then, a space is formed on the side of the first surface a of the first head portion 3Ab. In another step, a member to be joined to the first head portion 3Ab is inserted into this space, and the side of the first surface a of the first head portion 3Ab is joined to another member (specifically, the first conductive bonding agent 5A or the second insulating resin 14) which is not the first insulating resin 4. In this step, it is preferable to thin the surface of the first insulating resin 4 on the side on which the first head portion 3Ab of the member in the process schematic cross-sectional view of FIG. 10 is formed by dry etching or wet etching. As the dry etching, plasma etching is used, and it is preferable to use O2 (oxygen) gas, fluorine-based gas (CF4 or the like), Ar (argon) gas, N2 (nitrogen) gas, or mixed gas including two or more selected from the group consisting of O2 gas, fluorine-based gas, Ar gas, and N2 gas, or the like.

As a method of thinning the first insulating resin 4 on the side on which the first head portion 3Ab is formed, etching is preferable. When polishing is performed, the first head portion 3Ab is also scraped, and the side surface of the first column portion 3Aa is not exposed. A thickness d for thinning the first insulating resin 4 is a thickness that allows a sufficient space for another member to enter the side of the first surface a of the first head portion 3Ab. The thickness d for thinning the first insulating resin 4 is preferably 50 [nm] or more and 5000 [nm] or less, and more preferably 100 [nm] or more and 1000 [nm] or less.

Figure 12:
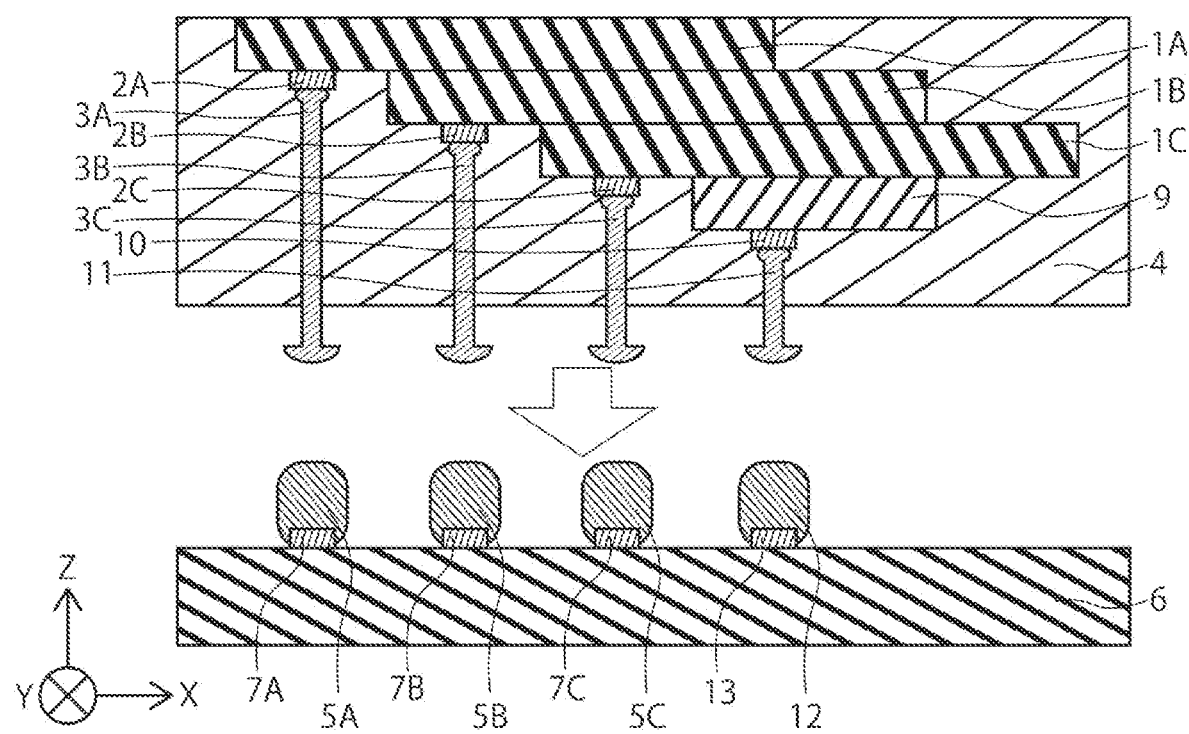
FIG. 12 is a process schematic cross-sectional view of the method for manufacturing a semiconductor device according to the embodiment.

Next, a step (S06) of electrically connecting the first conductive bonding agent 5A of the wiring substrate 6 on which the first conductive bonding agent 5A is formed and the first head portion 3Ab of the member where the first head portion 3Ab is exposed will be described with reference to the process schematic cross-sectional view of FIG. 12. As illustrated in the process schematic cross-sectional view of FIG. 12, the first head portion 3Ab of FIG. 11 is exposed, and the member in which the first insulating resin 4 is thinned is bonded to the wiring substrate 6. The first conductive bonding agent 5A is formed on the second pad 7A of the wiring substrate 6, and the first conductive bonding agent 5A is bonded to the first head portion 3Ab.

The second insulating resin 14 and/or the first conductive bonding agent 5A is provided between the first surface a of the first head portion 3Ab and the first insulating resin 4. In the process schematic cross-sectional view of FIG. 12, the second insulating resin 14 is in contact with the outer surface of the first conductive bonding agent 5A. In this step, preferably, an insulating resin having a flux function for removing an oxide film can be applied to the surface of the wiring substrate 6 on the side on which the second pad 7A and the first conductive bonding agent 5A are provided, and then bonded to a member in which the first insulating resin 4 is thinned. The insulating resin having a flux function for removing the oxide film is cured into the second insulating resin 14.

In this step, a member in which the first semiconductor element 1A or the like are sealed with the first insulating resin 4 may be heated by a flip chip bonder to connect the first conductive bonding agent 5A and the first wiring 3A, or the first conductive bonding agent 5A and the first wiring 3A may be connected in a reflow furnace after temporary pressure bonding by a flip chip bonder. A flux may be applied to and connected to a semiconductor element or a substrate.

By performing processing to provide a gap between the first head portion 3Ab of the first wiring 3A and the first insulating resin 4, the first conductive bonding agent 5A or the second insulating resin 14 enters between the first head portion 3Ab and the first insulating resin 4, the first conductive bonding agent 5A or the second insulating resin 14 can be bonded to the first surface a of the first head portion 3Ab, and a highly reliable wiring structure that is hardly broken can be obtained.

Second Embodiment

Figure 13:
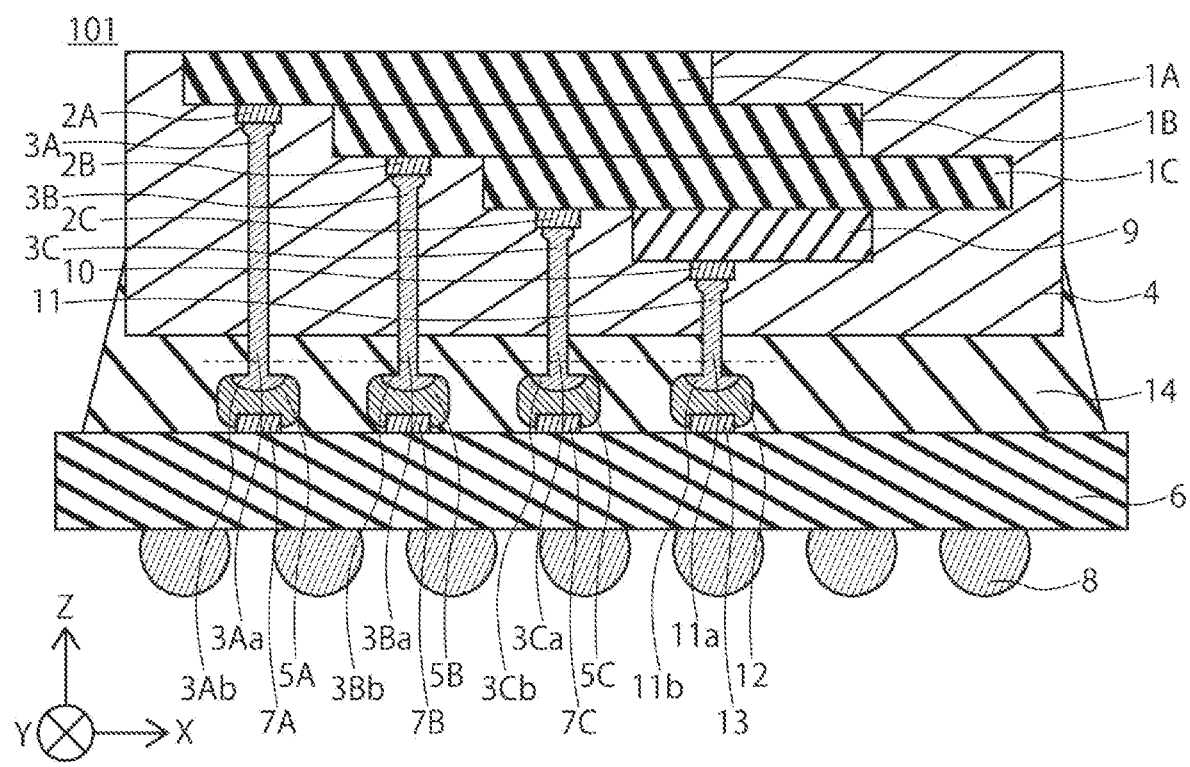
FIG. 13 is a schematic cross-sectional view of the semiconductor device according to the embodiment.

A second embodiment relates to a semiconductor device and a manufacturing method. FIG. 13 is a schematic cross-sectional view of a semiconductor device 101 according to a second embodiment. More specifically, the semiconductor device 101 of the embodiment is a semiconductor package on which a NAND flash memory chip or the like is mounted. Description of contents common to the first embodiment and the second embodiment will be omitted.

The second insulating resin 14 of the semiconductor device 101 is provided from the bottom surface to a part of the side surface of the first insulating resin 4.

An alternate long and short dash line which is a boundary between the linear conductor portion and the plated portion of the first wiring 3A in the semiconductor device 101 is located closer to the first semiconductor element 1A than the position of the semiconductor device 100. Although the columnar plated portion and the first insulating resin 4 are not bonded, the plating thickness can be increased.

Next, a connection portion between a member in which the first semiconductor element 1A or the like are sealed with the first insulating resin 4 and the wiring substrate 6 will be described with reference to a partial schematic view of the semiconductor device 101 illustrated in FIGS. 14 and 15.

Figure 14:
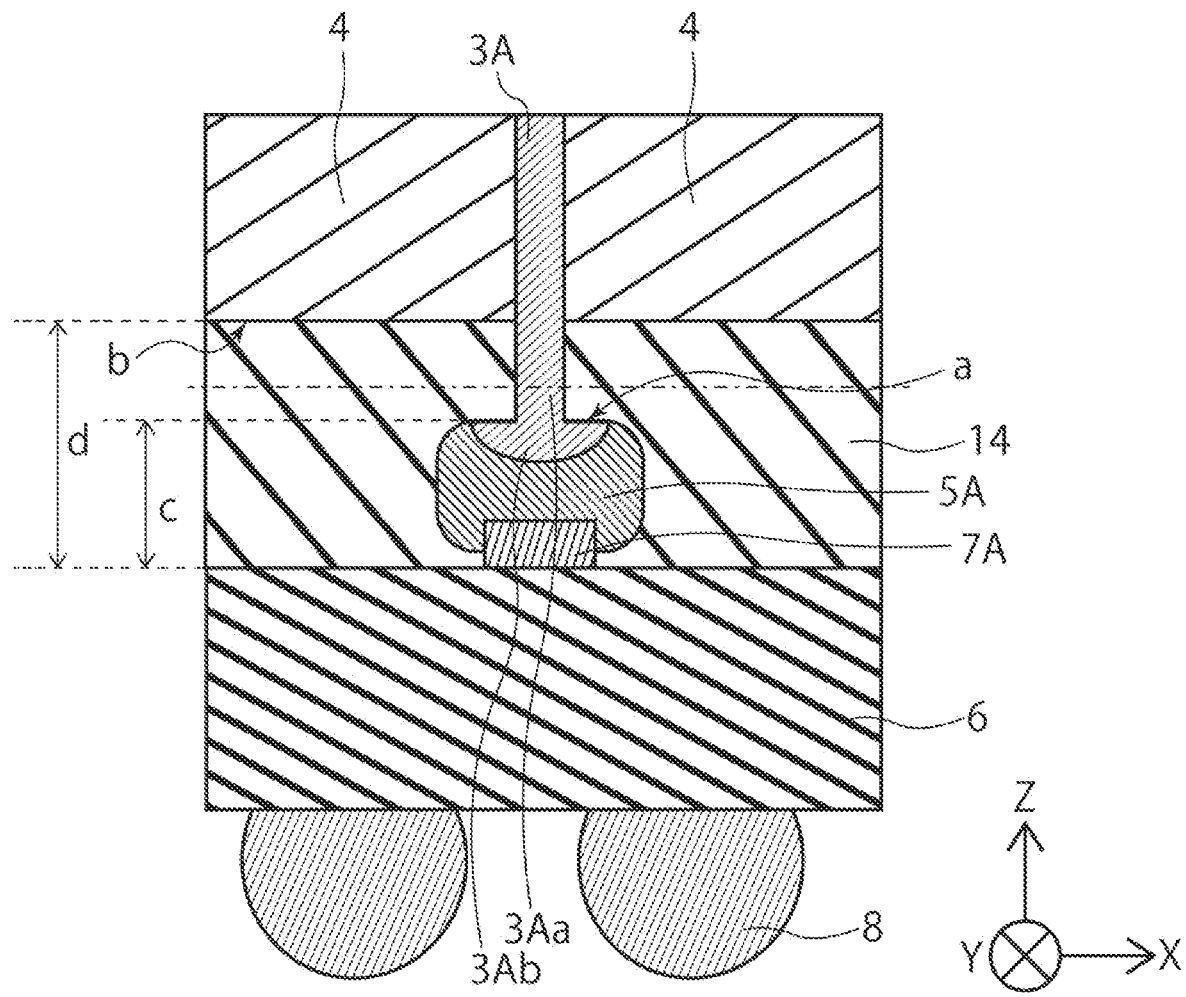
FIG. 14 is a partial schematic view of the semiconductor device according to the embodiment.

FIG. 14 is a schematic view illustrating a connection portion of the first wiring 3A with the wiring substrate 6. FIG. 14 illustrates the first wiring 3A, the first insulating resin 4, the first conductive bonding agent 5A, the second pad 7A, the wiring substrate 6, and the second insulating resin 14. The partial schematic view of FIG. 14 is different from the partial schematic view of FIG. 2 in that the first surface a of the first head portion 3Ab is in contact (directly) with the second insulating resin 14. The first conductive bonding agent 5A is not present between the first surface a of the first head portion 3Ab and the second surface b of the first insulating resin 4. A mode in which the first conductive bonding agent 5A and the first wiring 3A are in contact with each other is different between the semiconductor device 100 of the first embodiment and the semiconductor device 101 of the second embodiment. Also in the semiconductor device 101 of the partial schematic view of FIG. 14, the first distance c is shorter than the second distance d.

In the embodiment shown in the partial schematic view of FIG. 14, since the first surface a of the first head portion 3Ab is bonded to the second insulating resin 14, the first wiring 3A is hardly broken near the boundary between the first column portion 3Aa and the first head portion 3Ab, and reliability is high.

Figure 15:
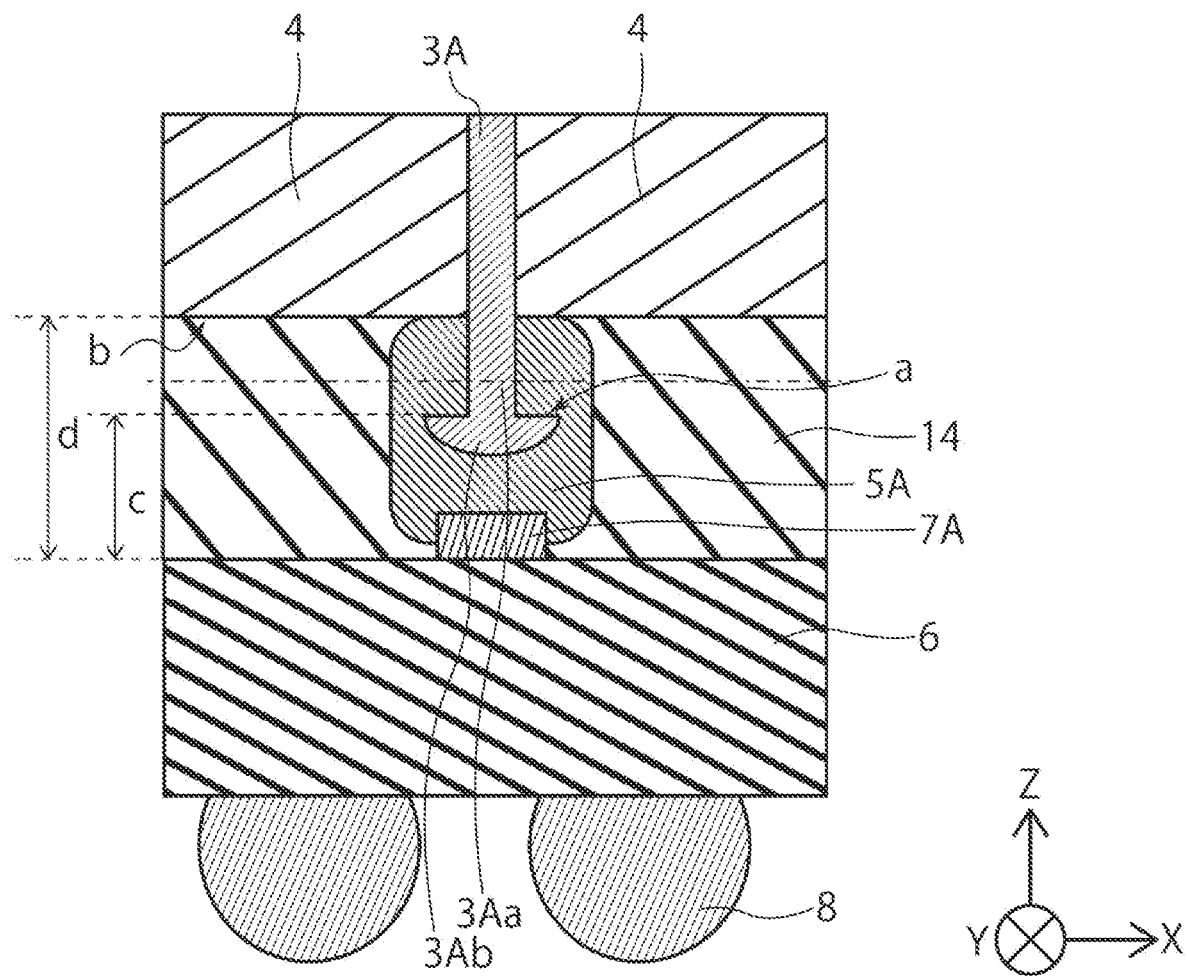
FIG. 15 is a partial schematic view of the semiconductor device according to the embodiment.

FIG. 15 is a schematic view illustrating a connection portion of the first wiring 3A with the wiring substrate 6. FIG. 15 is a modification of the form of FIG. 14. FIG. 15 illustrates the first wiring 3A, the first insulating resin 4, the second insulating resin 14, the first conductive bonding agent 5A, second pad 7A, and the wiring substrate 6. The partial schematic view of FIG. 15 is different from the partial schematic views of FIGS. 2 and 15 in that the first surface a of the first head portion 3Ab and the second surface b of the first insulating resin 4 are in contact (directly) with the first conductive bonding agent 5A. Also in the semiconductor device 101 of the partial schematic view of FIG. 14, the first distance c is shorter than the second distance d.

In the embodiment shown in the partial schematic view of FIG. 15, since the first surface a of the first head portion 3Ab is bonded to the first conductive bonding agent 5A, the first wiring 3A is hardly broken near the boundary between the first column portion 3Aa and the first head portion 3Ab, and reliability is high.

Figure 17:
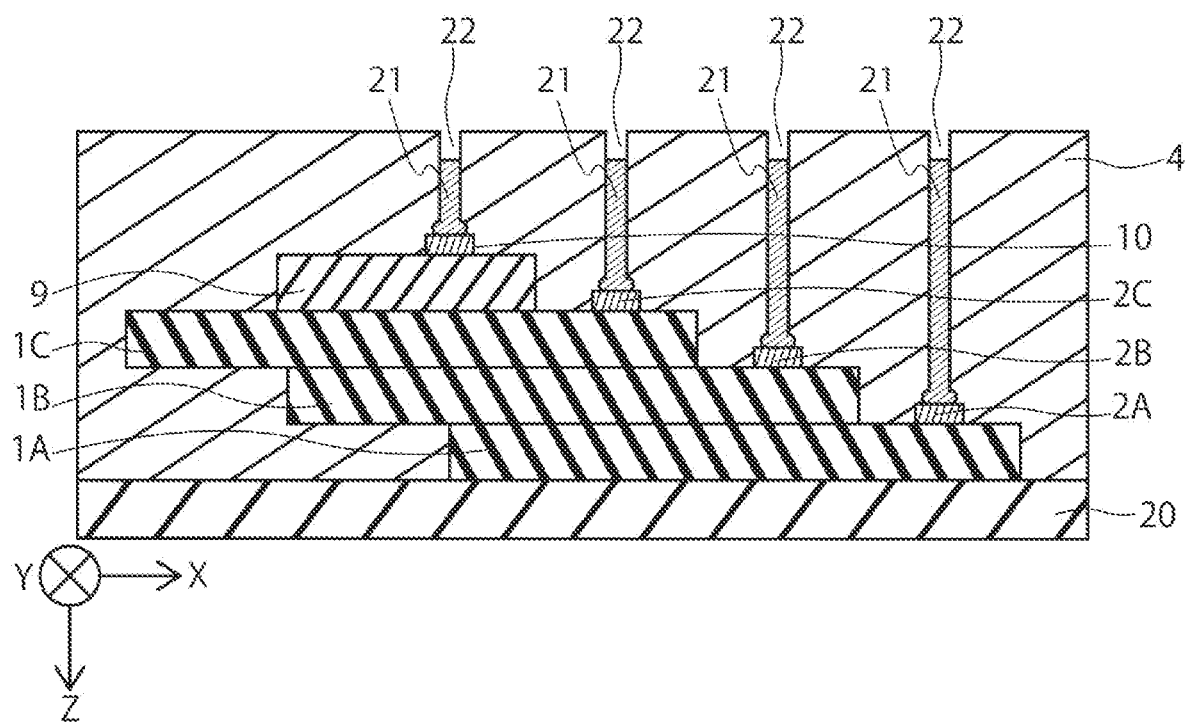
FIG. 17 is a process schematic cross-sectional view of the method for manufacturing a semiconductor device according to the embodiment.

Next, a method for manufacturing the semiconductor device 101 will be described. FIG. 16 is a flowchart of the method for manufacturing the semiconductor device 101. FIG. 17 is a process cross-sectional schematic view of the semiconductor device 101.

A method for manufacturing the semiconductor device 101 includes: a step (S01) of forming the columnar wiring 21 extending in a direction perpendicular to a surface of the first semiconductor element 1A; a step (S02) of sealing the first semiconductor element 1A where the columnar wiring 21 is formed with the first insulating resin 4; a step (S03) of exposing a tip end of the columnar wiring 21; a step (S07) of etching the tip end of the columnar wiring 21; a step (S04) of forming the first head portion 3Ab by electroless plating the tip end of the exposed columnar wiring 21; a step (S05) of thinning the first insulating resin 4 on a side on which the first head portion 3Ab is formed; and a step (S06) of electrically connecting the first conductive bonding agent 5A of the wiring substrate 6 on which the first conductive bonding agent 5A is formed and the first head portion 3Ab of a member where the first head portion 3Ab is exposed.

Steps other than the step (S06) of electrically connecting the first conductive bonding agent 5A of the wiring substrate 6 on which the first conductive bonding agent 5A is formed and the first head portion 3Ab of the member where the first head portion 3Ab is exposed and the step (S07) of etching the tip end of the columnar wiring 21 are the same as the steps of the method for manufacturing the semiconductor device 100 according to the first embodiment.

The step (S07) of etching the tip end of the columnar wiring 21 is performed between the step (S03) of exposing the tip end of the columnar wiring 21 and the step (S04) of electroless plating the exposed tip end of the columnar wiring 21 to form the first head portion 3Ab. The first head portion 3Ab is formed at the tip end of the etched columnar wiring 21. As illustrated in the process schematic cross-sectional view of FIG. 17, the tip end of the columnar wiring 21 is partially removed by dry etching or wet etching. Since electroless plating is also formed on a removed portion 22, the thickness of the plated portion in the second embodiment is larger than that in the first embodiment. The thickness of the plated portion can be controlled by the presence or absence of execution of the step (S07) of etching the tip end of the columnar wiring 21 and the etching depth.

In the step (306) of electrically connecting the first conductive bonding agent 5A of the wiring substrate 6 on which the first conductive bonding agent 5A of the second embodiment is formed and the first head portion 3Ab of the member where the first head portion 3Ab is exposed, the wiring substrate 6 coated with the resin that becomes the second insulating resin 14 after curing is used.

The resin to be the second insulating resin 14 after curing may contain alcohols and/or organic acids. The resin to be the second insulating resin 14 after curing is a curable insulating resin used for flip chip mounting as an underfill agent. The alcohols and/or organic acids contained in the resin that becomes the second insulating resin 14 after curing preferably has a flux function of removing the oxide film on the surface of the first wiring 3A.

The second insulating resin 14 has an insulating property and contains a resin. The second insulating resin 14 contains one or more selected from the group including an epoxy-based resin, a phenol-based resin, a polyimide-based resin, a polyamide-based resin, an acryl-based resin, a polybenzoxazole-based resin, a silicone-based resin, and a benzocyclobutene-based resin. Examples of the epoxy-based resin are not particularly limited, and include bisphenol-type epoxy resins such as bisphenol A type, bisphenol F type, bisphenol AD type, and bisphenol S type; novolac-type epoxy resins such as phenol novolac type and cresol novolac type; aromatic epoxy resins such as resorcinol type epoxy resins and trisphenol methane triglycidyl ether; naphthalene-type epoxy resins; fluorene-type epoxy resins; dicyclopentadiene-type epoxy resins; polyether-modified epoxy resins; benzophenone-type epoxy resins; aniline-type epoxy resins; NBR-modified epoxy resins; CTBN-modified epoxy resins; and hydrogenated products of these. Among them, naphthalene-type epoxy resins and dicyclopentadiene-type epoxy resins are preferable from the viewpoint of good adhesion to Si. In addition, benzophenone-type epoxy resins are also preferable because rapid curability is easily obtained. These epoxy resins may be used alone or in combination of two or more kinds of them. In addition, the second insulating resin 14 may contain an insulating filler such as silica or alumina. In addition, the resin to be the second insulating resin 14 after curing may contain alcohols and/or organic acids. The resin to be the second insulating resin 14 after curing is a curable insulating resin used for flip chip mounting as an underfill agent. The alcohols and/or organic acids contained in the resin that becomes the second insulating resin 14 after curing preferably has a flux function of removing the oxide film on the surface of the first wiring 3A.

Examples of the alcohols contained in the resin to be the second insulating resin 14 after curing include at least one selected from methanol, ethanol, isopropyl alcohol, polyvinyl alcohol, ethylene glycol, propylene glycol, diethylene glycol, glycerin, triethylene glycol, tetraethylene glycol, carbitol, cellosolve alcohol, or the like. In addition, an alkyl ether-based material may be used. Examples include diethylene glycol monobutyl ether and triethylene glycol dimethyl ether. An alkane, an amine compound, or the like can also be used. Examples include formamide and dimethylformamide. These may be used alone or a plurality of substances may be mixed. Examples of the organic acid contained in the resin that becomes the second insulating resin 14 after curing include formic acid, acetic acid, benzoic acid, abietic acid, parastrinic acid, dehydroabietic acid, isopimaric acid, neoabietic acid, pimaric acid, and rosin. The alcohols and/or organic acids may be used alone, or a plurality of alcohols and/or organic acids may be mixed. The resin having a function of removing the oxide film is applied by various methods such as a dispensing method, a printing method, a jet method, and a screw method.

By performing processing to provide a gap between the first head portion 3Ab of the first wiring 3A and the first insulating resin 4, the first conductive bonding agent 5A or/and the second insulating resin 14 enters between the first head portion 3Ab and the first insulating resin 4, the first conductive bonding agent 5A or the second insulating resin 14 can be bonded to the first surface a of the first head portion 3Ab, and a highly reliable wiring structure that is hardly broken can be obtained.

The second insulating resin 14 of the second embodiment forms a good bonding with the first insulating resin 4, the first wiring 3A, the first conductive bonding agent 5A, and the wiring substrate 6. Since the first head portion 3Ab of the first wiring 3A and the vicinity are stably joined to other members with a large area where a good bonding is formed, the reliability of the wiring is high.

Third Embodiment

Figure 18:
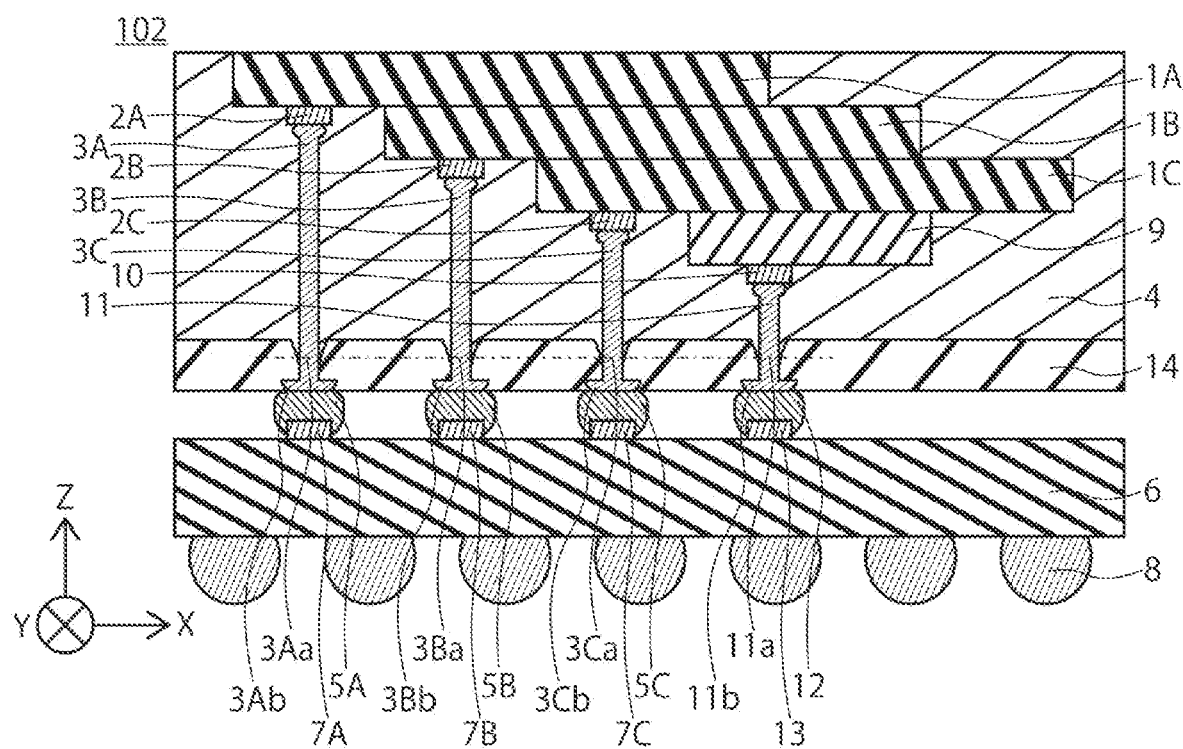
FIG. 18 is a process schematic cross-sectional view of the method for manufacturing a semiconductor device according to the embodiment.

A third embodiment relates to a semiconductor device and a manufacturing method. FIG. 18 is a schematic cross-sectional view of a semiconductor device 102 according to a third embodiment. More specifically, the semiconductor device 102 of the third embodiment is a semiconductor package on which a NAND flash memory chip or the like is mounted. Description of contents common to the first embodiment, the second embodiment, and the third embodiment will be omitted.

There is a gap between the second insulating resin 14 of the semiconductor device 102 and the wiring substrate 6, and the tip end of the first head portion 3Ab is a flat surface. The surfaces of the second insulating resin 14 and the first wiring 3A on the side of the wiring substrate 6 are flush with each other.

An alternate long and short dash line which is a boundary between the linear conductor portion and the plated portion of the first wiring 3A in the semiconductor device 102 is located in the second insulating resin 14. The columnar plated portion is not bonded to the first insulating resin 4, but is bonded to the second insulating resin 14.

Next, a connection portion between a member in which the first semiconductor element 1A or the like are sealed with the first insulating resin 4 and the wiring substrate 6 will be described with reference to a partial schematic view of the semiconductor device 102 illustrated in FIG. 19.

Figure 19:
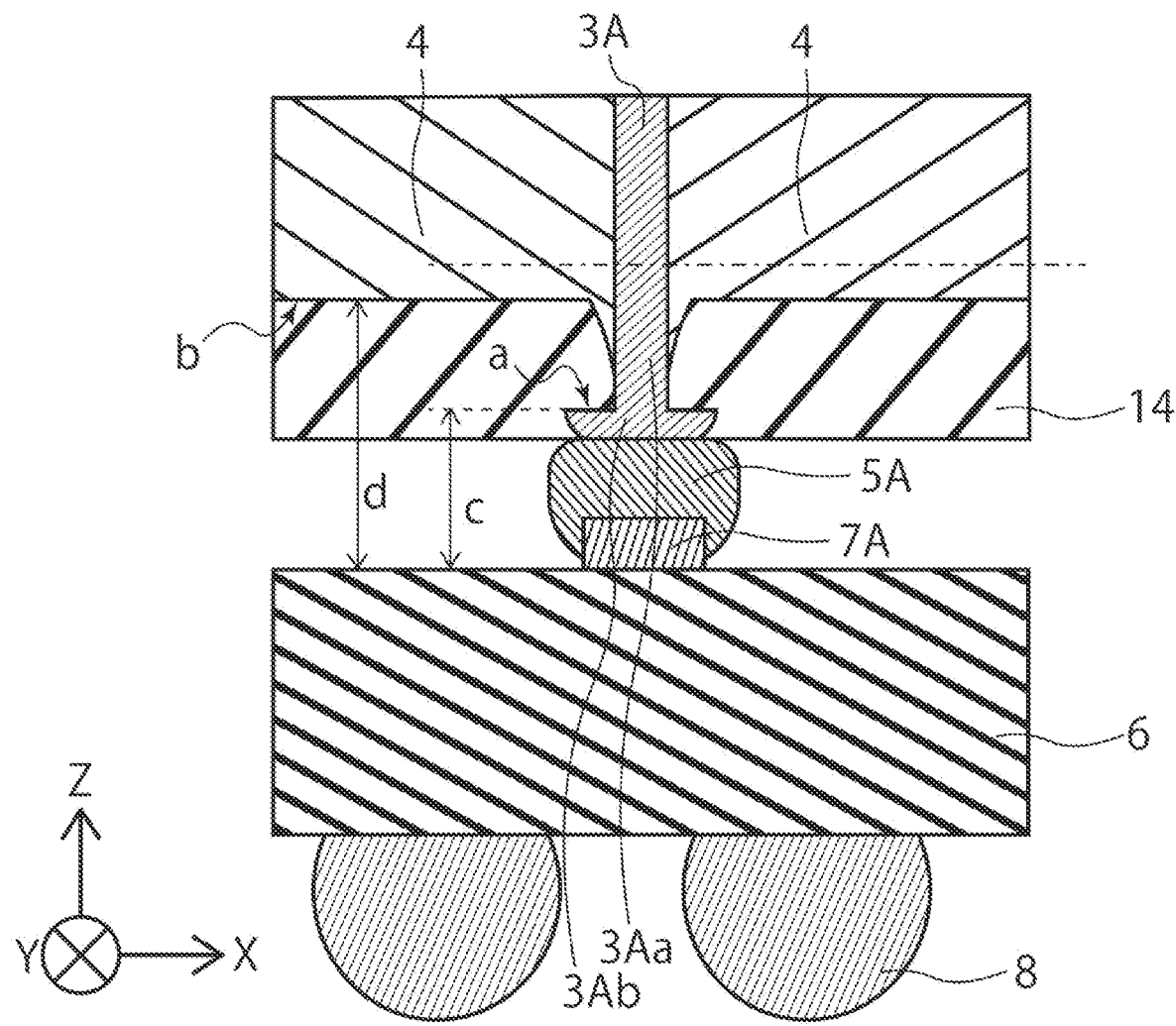
FIG. 19 is a process schematic cross-sectional view of the method for manufacturing a semiconductor device according to the embodiment.

FIG. 19 is a schematic view illustrating a connection portion of the first wiring 3A with the wiring substrate 6. FIG. 19 illustrates the first wiring 3A, the first insulating resin 4, the first conductive bonding agent 5A, the second pad 7A, the wiring substrate 6, and the second insulating resin 14. The partial schematic view of FIG. 19 is different from the partial schematic view of FIG. 2 in that the flat surface at the tip end of the first head portion 3Ab is bonded to the first conductive bonding agent 5A, and the first surface a of the first head portion 3Ab is bonded to the second insulating resin 14. The first conductive bonding agent 5A is not present between the first surface a of the first head portion 3Ab and the second surface b of the first insulating resin 4. A mode in which the first conductive bonding agent 5A and the first wiring 3A are in contact with each other is different between the semiconductor device 100 of the first embodiment and the semiconductor device 102 of the third embodiment. Also in the semiconductor device 102 of the partial schematic view of FIG. 19, the first distance c is shorter than the second distance d.

In the embodiment shown in the partial schematic view of FIG. 19, since the first surface a of the first head portion 3Ab is bonded to the second insulating resin 14, the first wiring 3A is hardly broken near the boundary between the first column portion 3Aa and the first head portion 3Ab, and reliability is high.

In the form shown in the partial schematic view of FIG. 19, it is shown that the thickness of the first insulating resin 4 is thicker in the peripheral portion of the first column portion 3Aa. In the process of etching and partially removing the first insulating resin 4, a portion of the first insulating resin 4 in contact with the side surface of the first column portion 3Aa may remain without being partially removed. As shown in the partial schematic view of FIG. 19, the first insulating resin 4 may include a tapered portion (a hollow truncated cone shape in which the first column portion 3Aa exists at the center) from the side of the first semiconductor element 1A to the side of the first head portion 3Ab. In the point i of FIG. 2, the first insulating resin 4 is out of the tapered thick portion around the first column portion 3Aa, or even if the first insulating resin 4 is tapered thick, the thickness of the thick portion is small. Therefore, in the calculation of the second distance d, the difference in the presence or absence of the tapered thick portion around the first column portion 3Aa of the first insulating resin 4 is negligible.

Figure 20:
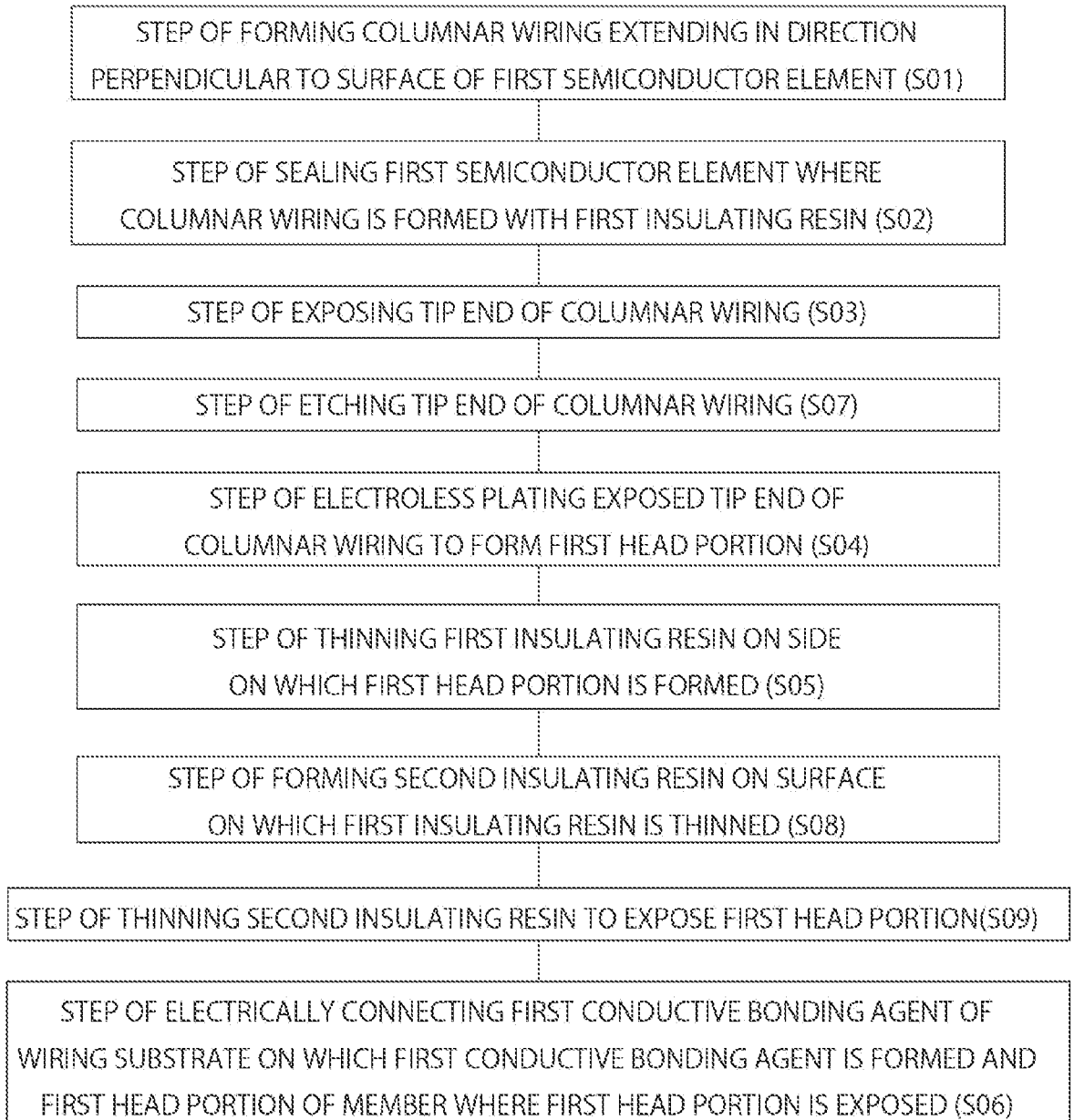
FIG. 20 is a flowchart of a method for manufacturing a semiconductor device according to an embodiment.
Figure 21:
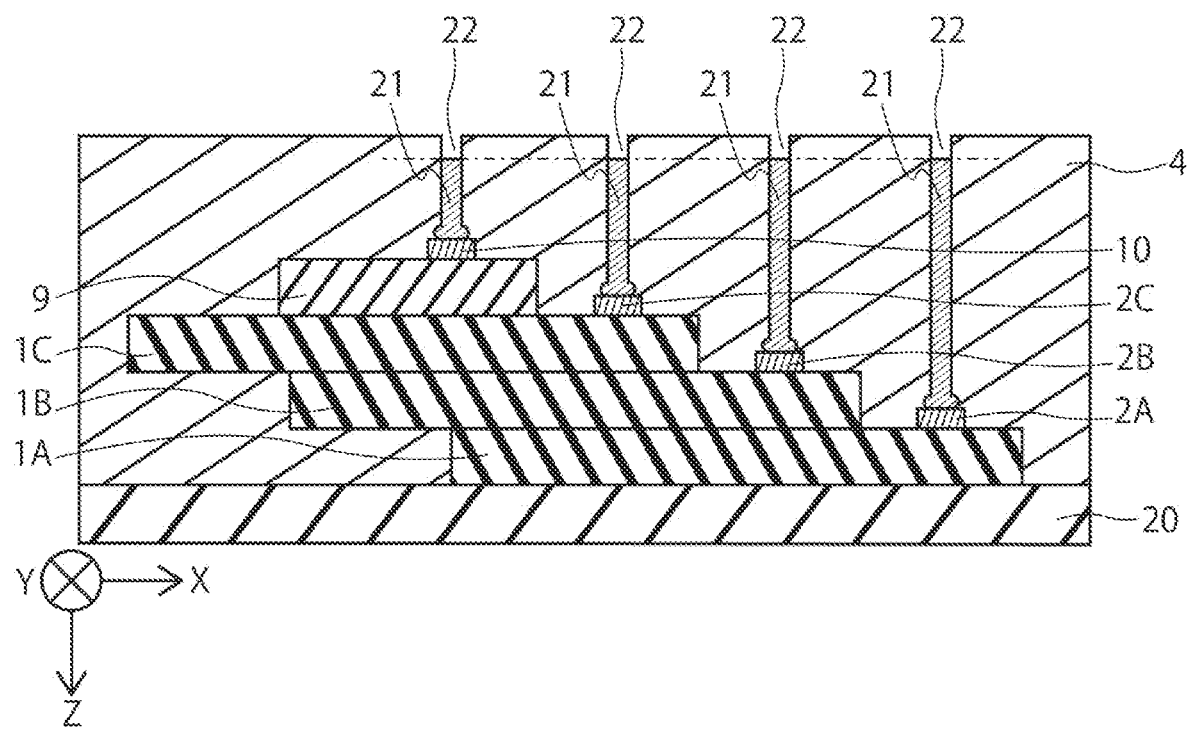
FIG. 21 is a process schematic cross-sectional view of the method for manufacturing a semiconductor device according to the embodiment.
Figure 22:
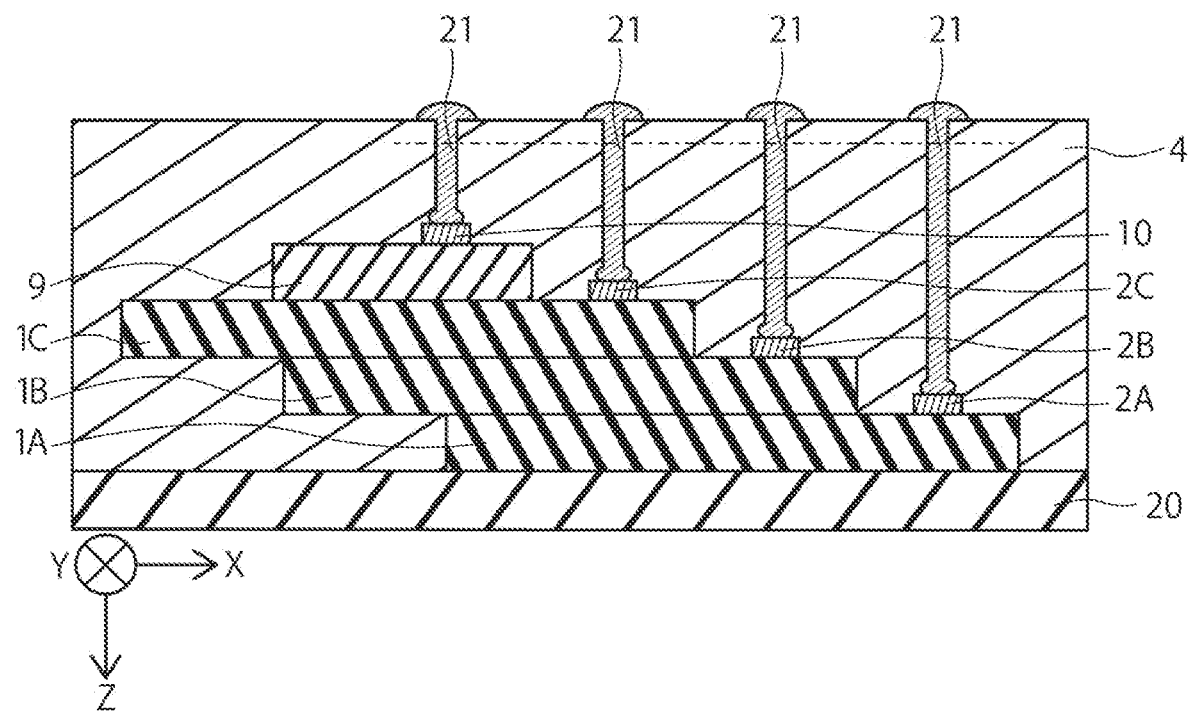
FIG. 22 is a process schematic cross-sectional view of the method for manufacturing a semiconductor device according to the embodiment.

Next, a method for manufacturing the semiconductor device 102 will be described. FIG. 20 is a flowchart of the method for manufacturing the semiconductor device 102. FIGS. 21 to 25 are process cross-sectional schematic views of the semiconductor device 102.

A method for manufacturing the semiconductor device 102 includes: a step (S01) of forming the columnar wiring 21 extending in a direction perpendicular to a surface of the first semiconductor element 1A; a step (S02) of sealing the first semiconductor element 1A where the columnar wiring 21 is formed with the first insulating resin 4; a step (S03) of exposing a tip end of the columnar wiring 21; a step (S07) of etching the tip end of the columnar wiring 21; a step (S04) of forming the first head portion 3Ab by electroless plating the tip end of the exposed columnar wiring 21; a step (S05) of thinning the first insulating resin 4 on a side on which the first head portion 3Ab is formed; a step (S08) of forming the second insulating resin 14 on a surface on which the first insulating resin 4 is thinned; a step (S09) of thinning the second insulating resin 14 to expose the first head portion 3Ab; and a step (S06) of electrically connecting the first conductive bonding agent 5A of the wiring substrate 6 on which the first conductive bonding agent 5A is formed and the first head portion 3Ab of a member where the first head portion 3Ab is exposed.

Steps other than the step (S08) of forming the second insulating resin 14 on the surface on which the first insulating resin 4 is thinned, the step (S09) of thinning the second insulating resin 14 to expose the first head portion 3Ab, and the step (S06) of electrically connecting the first conductive bonding agent 5A of the wiring substrate 6 on which the first conductive bonding agent 5A is formed and the first head portion 3Ab of the member where the first head portion 3Ab is exposed are the same as the steps of the method for manufacturing the semiconductor device 100 of the first embodiment or the steps of the method for manufacturing the semiconductor device 101 of the second embodiment.

The step (S08) of forming the second insulating resin 14 on the surface on which the first insulating resin 4 is thinned is performed after the step (S05) of thinning the first insulating resin 4 on the side on which the first head portion 3Ab is formed. In the step (S05) of thinning the first insulating resin 4 on the side on which the first head portion 3Ab is formed, the boundary between the plated portion and the linear conductor portion is made to exist in the second insulating resin 14. Therefore, as illustrated in the process schematic cross-sectional views of FIGS. 21 and 22, the first insulating resin 4 is etched until the boundary between the plated portion and the linear conductor portion is exposed to thin the first insulating resin 4. Then, as illustrated in the process schematic cross-sectional view of FIG. 23, the second insulating resin 14 is formed on the thinned surface of the first insulating resin 4 of the member in which the first insulating resin 4 is thinned. The second insulating resin 14 of the third embodiment is preferably an organic insulating resin used for rewiring or the like. The second insulating resin 14 is formed to completely cover the first wiring 3A. By adjusting the etching depth of the first insulating resin 4 (including adjustment of the position of the boundary between the plated portion and the linear conductor portion), the semiconductor device 102 (not illustrated) in which the boundary between the plated portion and the linear conductor portion exists in the first insulating resin 4 can be manufactured, or the semiconductor device 102 in which the boundary between the plated portion and the linear conductor portion exists in the second insulating resin 14 can be manufactured.

Figure 23:
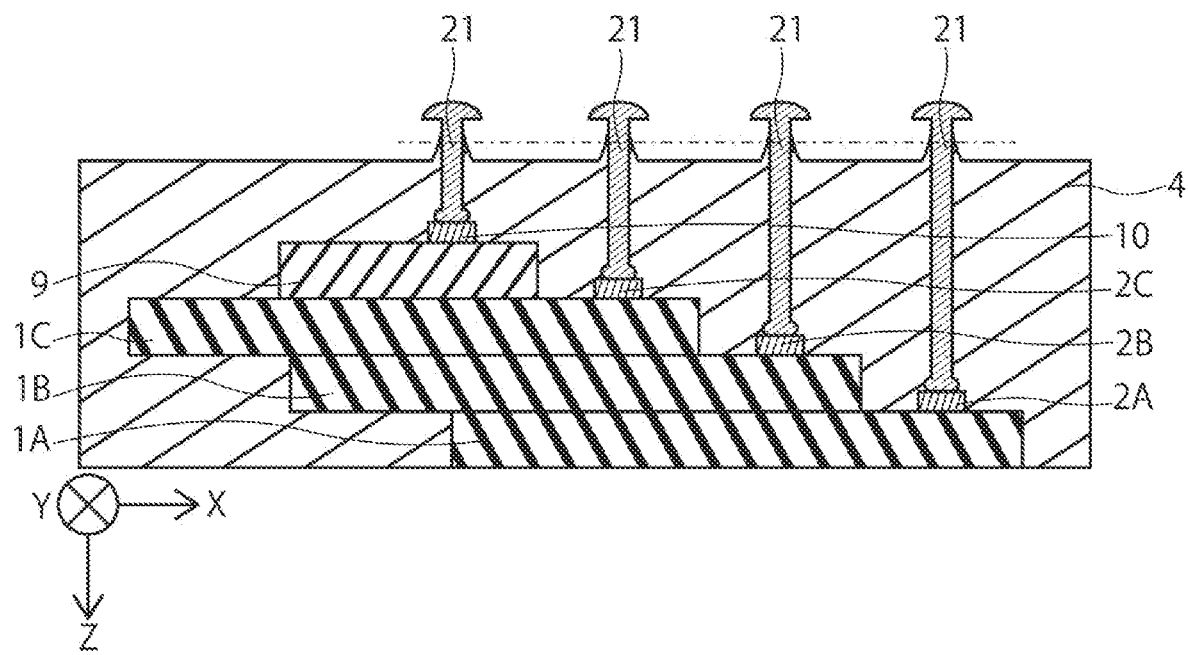
FIG. 23 is a process schematic cross-sectional view of the method for manufacturing a semiconductor device according to the embodiment.
Figure 24:
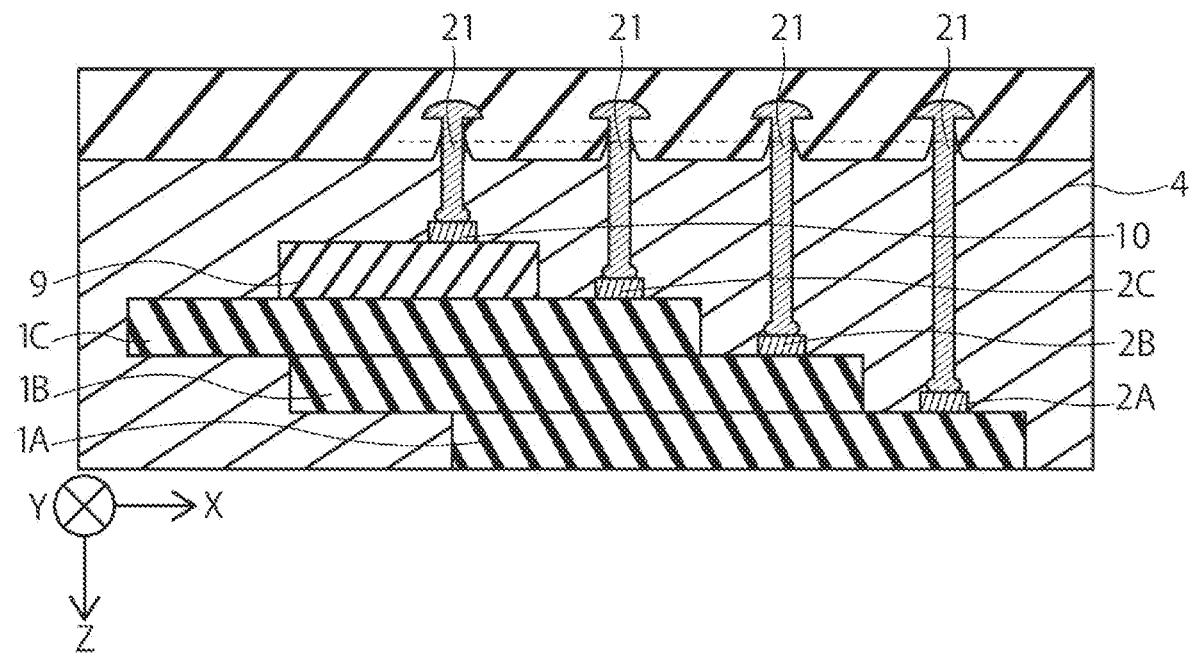
FIG. 24 is a process schematic cross-sectional view of the method for manufacturing a semiconductor device according to the embodiment.
Figure 25:
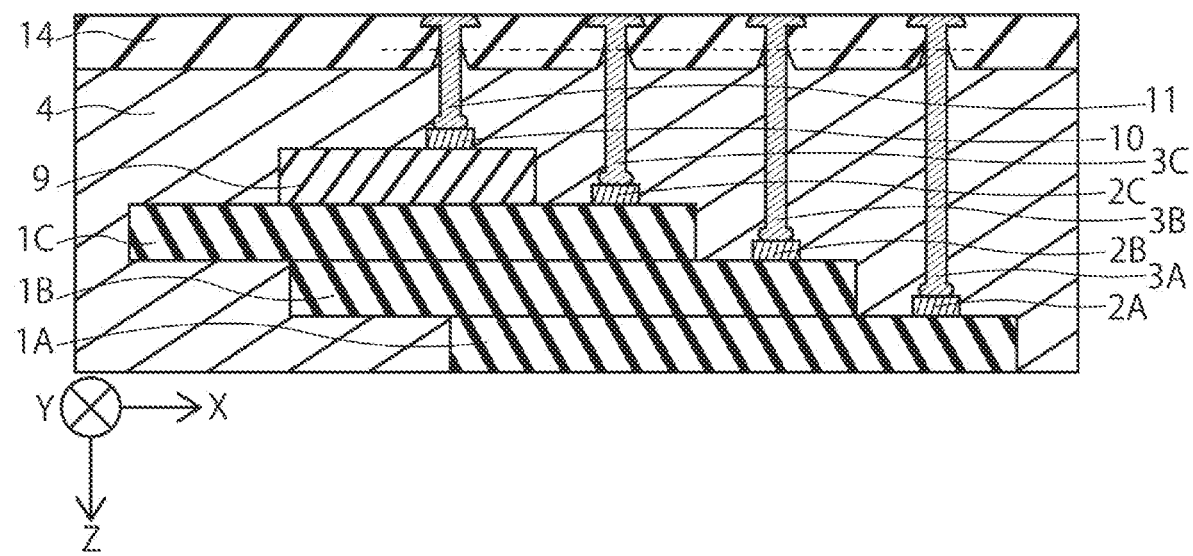
FIG. 25 is a schematic cross-sectional view of the semiconductor device according to the embodiment.

The step (S09) of thinning the second insulating resin 14 to expose the first head portion 3Ab is performed between the step (S08) of forming the second insulating resin 14 on the thinned surface of the first insulating resin 4 and the step (S06) of electrically connecting the first conductive bonding agent 5A of the wiring substrate 6 on which the first conductive bonding agent 5A is formed and the first head portion 3Ab of the member from which the first head portion 3Ab is exposed. As shown in the process schematic cross-sectional view of FIG. 24, the second insulating resin 14 of the member on which the second insulating resin 14 is formed in the process schematic cross-sectional view of FIG. 23 is thinned. The second insulating resin 14 is thinned in a manner that the tip end of the first head portion 3Ab is also scraped by a mechanical polishing method, a chemical polishing method, chemical mechanical polishing (CMP), or the like. By thinning the second insulating resin 14 in this manner, it is possible to obtain a member in which the surfaces of the second insulating resin 14 and the first wiring 3A on the side of the wiring substrate 6 illustrated in the process schematic cross-sectional view of FIG. 25 are flush with each other. The member illustrated in the process schematic cross-sectional view of FIG. 25 can be bonded to the member on which the first conductive bonding agent 5A is formed.

By performing processing to provide a gap between the first head portion 3Ab of the first wiring 3A and the first insulating resin 4, the second insulating resin 14 enters between the first head portion 3Ab and the first insulating resin 4, the second insulating resin 14 can be bonded to the first surface a of the first head portion 3Ab, and a highly reliable wiring structure that is hardly broken can be obtained.

The second insulating resin 14 of the third embodiment forms a good bonding with the first insulating resin 4 and the first wiring 3A. Since the first head portion 3Ab of the first wiring 3A and the vicinity are stably joined to other members with a large area where a good bonding is formed, the reliability of the wiring is high.

Fourth Embodiment

Figure 26:
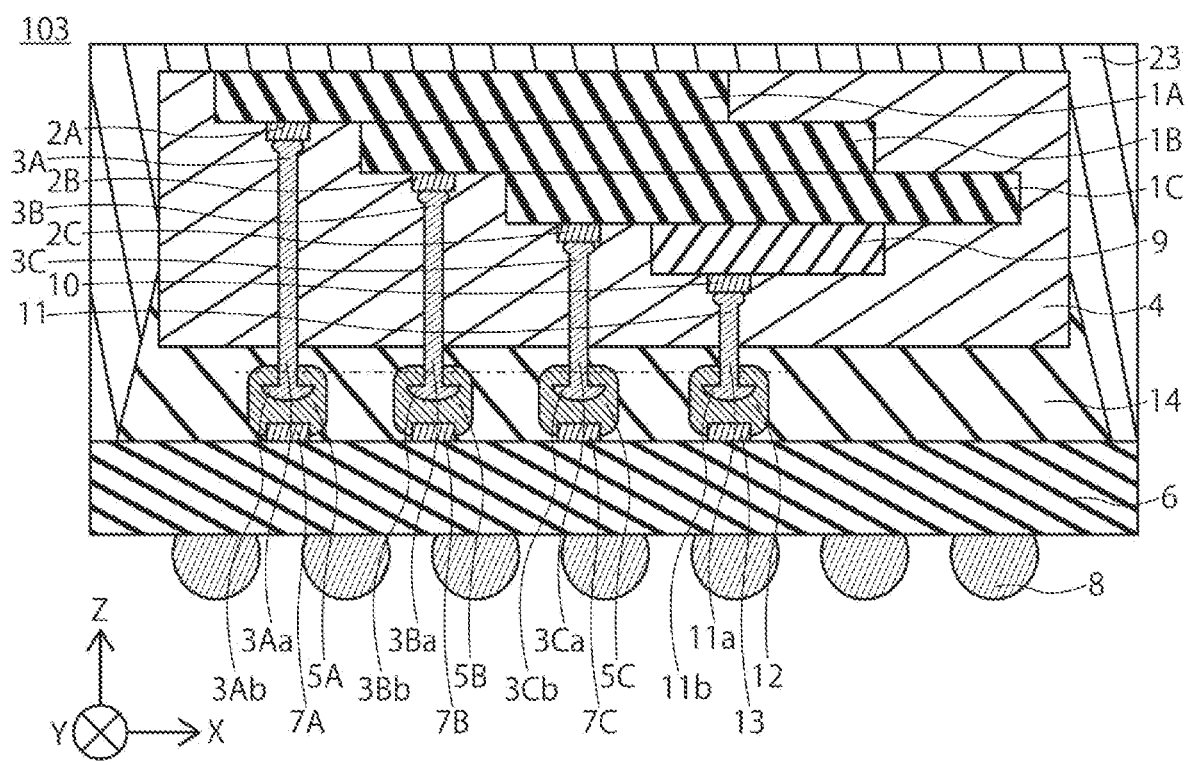
FIG. 26 is a schematic cross-sectional view of the semiconductor device according to the embodiment.

A fourth embodiment relates to a semiconductor device. FIG. 26 is a schematic cross-sectional view of a semiconductor device 103 according to a fourth embodiment. More specifically, the semiconductor device 103 of the fourth embodiment is a semiconductor package on which a NAND flash memory chip or the like is mounted. Description of contents common to the first embodiment, the second embodiment, the third embodiment, and the fourth embodiment will be omitted.

The semiconductor device 103 illustrated in FIG. 26 is a modification of the semiconductor device 100 of the first embodiment and the semiconductor device 101 of the second embodiment. In the semiconductor device 103, the second insulating resin 14 of the second embodiment is used for the second insulating resin 14 of the semiconductor device 100 of the first embodiment. The semiconductor device 103 includes a third insulating resin 23 that covers the first insulating resin 4 and the second insulating resin 14.

The third insulating resin 23 is an insulating resin. The third insulating resin 23 is in contact with the member in which the first semiconductor element 1A is sealed with the first insulating resin 4, the second insulating resin 14, and the wiring substrate 6.

The third insulating resin 23 contains one or more selected from the group including an epoxy-based resin, a phenol-based resin, a polyimide-based resin, a polyamide-based resin, an acryl-based resin, a polybenzoxazole-based resin, a silicone-based resin, and a benzocyclobutene-based resin. Examples of the epoxy-based resin are not particularly limited, and include bisphenol-type epoxy resins such as bisphenol A type, bisphenol F type, bisphenol AD type, and bisphenol S type; novolac-type epoxy resins such as phenol novolac type and cresol novolac type; aromatic epoxy resins such as resorcinol type epoxy resins and trisphenol methane triglycidyl ether; naphthalene-type epoxy resins; fluorene-type epoxy resins; dicyclopentadiene-type epoxy resins; polyether-modified epoxy resins; benzophenone-type epoxy resins; aniline-type epoxy resins; NBR-modified epoxy resins; CTBN-modified epoxy resins; and hydrogenated products of these. Among them, naphthalene-type epoxy resins and dicyclopentadiene-type epoxy resins are preferable from the viewpoint of good adhesion to Si. In addition, benzophenone-type epoxy resins are also preferable because rapid curability is easily obtained. These epoxy resins may be used alone or in combination of two or more kinds of them. In addition, the third insulating resin 23 may contain an insulating filler such as silica or alumina.

Also in the semiconductor device 103 of the fourth embodiment, by performing processing to provide a gap between the first head portion 3Ab of the first wiring 3A and the first insulating resin 4, the first conductive bonding agent 5A or the second insulating resin 14 enters between the first head portion 3Ab and the first insulating resin 4, the first conductive bonding agent 5A can be bonded to the first surface a of the first head portion 3Ab, and a highly reliable wiring structure that is hardly broken can be obtained.

The first conductive bonding agent 5A of the fourth embodiment forms a good bonding with the first insulating resin 4, the second insulating resin 14, and the first wiring 3A. Since the first head portion 3Ab of the first wiring 3A and the vicinity are stably joined to other members with a large area where a good bonding is formed, the reliability of the wiring is high.

Fifth Embodiment

Figure 27:
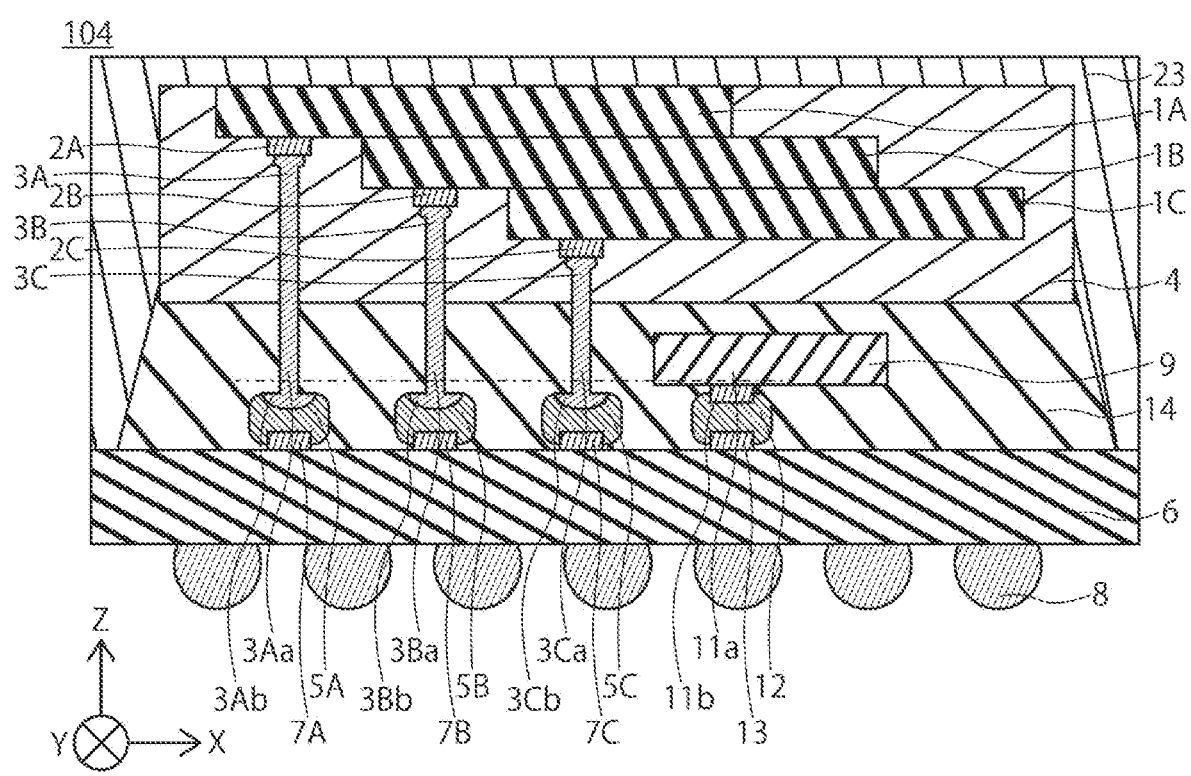
FIG. 27 is a schematic cross-sectional view of the semiconductor device according to the embodiment.

A fifth embodiment relates to a semiconductor device. FIG. 27 is a schematic cross-sectional view of a semiconductor device 104 according to a fifth embodiment. More specifically, the semiconductor device 104 of the fifth embodiment is a semiconductor package on which a NAND flash memory chip or the like is mounted. Description of contents common to the first embodiment, the second embodiment, the third embodiment, the fourth embodiment, and the fifth embodiment will be omitted.

The semiconductor device 104 illustrated in FIG. 27 is a modification of the semiconductor device 101 of the second embodiment and the semiconductor device 103 of the fourth embodiment. In the semiconductor device 104, the second semiconductor element 9 is not sealed with the first insulating resin 4, and the second semiconductor element 9 is connected to the second conductive bonding agent 12 without interposing the second wiring 11. Although not illustrated, a resin different from the second insulating resin 14 may be applied between the second semiconductor element 9 and the wiring substrate 6.

In a case where the wiring structure of the embodiment is adopted, the layout of the second semiconductor element 9 used as, for example, a controller chip can be freely designed while improving the reliability of the wiring.

Sixth Embodiment

Figure 28:
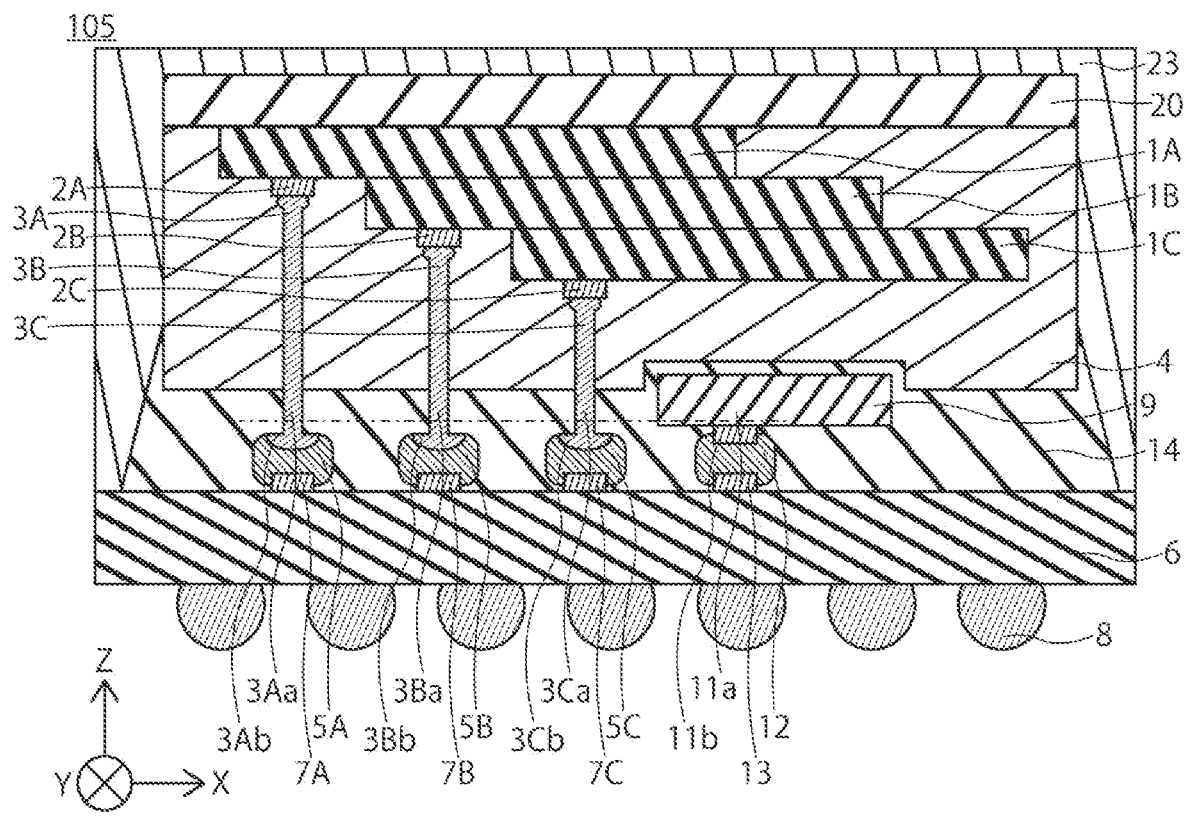
FIG. 28 is a schematic cross-sectional view of the semiconductor device according to the embodiment.

A sixth embodiment relates to a semiconductor device. FIG. 28 is a schematic cross-sectional view of a semiconductor device 105 according to a sixth embodiment. More specifically, the semiconductor device 105 of the sixth embodiment is a semiconductor package on which a NAND flash memory chip or the like is mounted. Description of contents common to the first embodiment, the second embodiment, the third embodiment, the fourth embodiment, the fifth embodiment, and the sixth embodiment will be omitted.

The semiconductor device 105 illustrated in FIG. 28 is a modification of the semiconductor device 104 of the fifth embodiment. In the semiconductor device 105, the first insulating resin 4 is provided with a recessed shape in accordance with the shape of the second semiconductor element 9. Since the second semiconductor element 9 is located in the recessed portion, the height of the semiconductor device 105 can be reduced, and the thickness of the second insulating resin 14 can be reduced. In addition, the support substrate 20 may be provided between the third insulating resin 23 of the semiconductor device 105 and the first semiconductor element 1A. In the first embodiment or the like, the support substrate 20 is removed, but the package can be performed while the support substrate 20 is left. Although not illustrated, a resin different from the second insulating resin 14 may be applied between the second semiconductor element 9 and the wiring substrate 6.

In a case where the wiring structure of the embodiment is adopted, the layout of the second semiconductor element 9 used as, for example, a controller chip can be freely designed while improving the reliability of the wiring.

Seventh Embodiment

Figure 29:
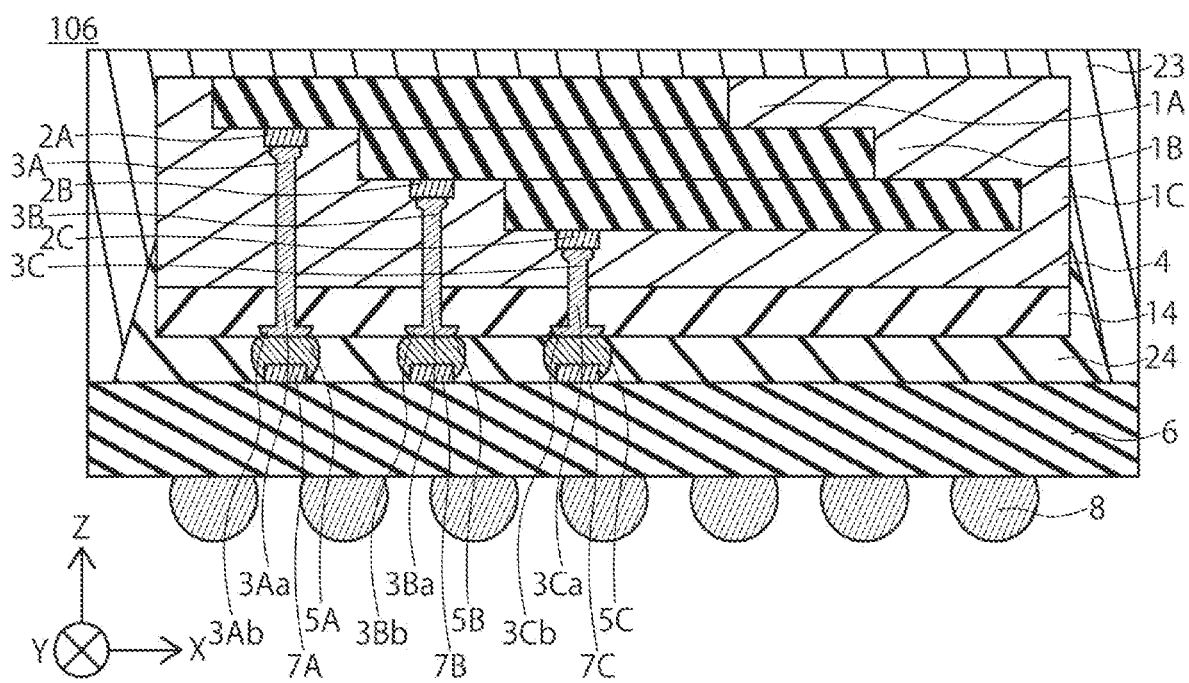
FIG. 29 is a schematic cross-sectional view of the semiconductor device according to the embodiment.

A seventh embodiment relates to a semiconductor device. FIG. 29 is a schematic cross-sectional view of a semiconductor device 106 according to a seventh embodiment. More specifically, the semiconductor device 106 of the seventh embodiment is a semiconductor package on which a NAND flash memory chip or the like is mounted. Description of contents common to the first embodiment, the second embodiment, the third embodiment, the fourth embodiment, the fifth embodiment, the sixth embodiment, and the seventh embodiment will be omitted.

The semiconductor device 106 illustrated in FIG. 29 is a modification of the semiconductor device 101 of the second embodiment, the semiconductor device 102 of the third embodiment, and the semiconductor device 103 of the fourth embodiment. In the semiconductor device 106, a fourth insulating resin 24 is provided between the second insulating resin 14 and the wiring substrate 6, and the second semiconductor element 9 is provided at a position shifted in the Y direction in FIG. 29.

The surfaces of the second insulating resin 14 and the first wiring 3A on the side of the wiring substrate 6 are flush with each other, and the fourth insulating resin 24 is provided between the second insulating resin 14 and the first wiring 3A that are flush with the wiring substrate 6. The fourth insulating resin 24 is preferably selected from materials indicated by the second insulating resin 14 of the second embodiment.

The thermal expansion coefficient of the fourth insulating resin 24 is preferably larger than those of the first insulating resin 4 and the wiring substrate 6. It is more preferable that the relationship of the thermal expansion coefficient of the fourth insulating resin 24>the thermal expansion coefficient of the wiring substrate 6>the thermal expansion coefficient of the first insulating resin 4 is satisfied. When the thermal expansion coefficient of the fourth insulating resin 24 is smaller than the thermal expansion coefficient of the wiring substrate 6, there is a possibility that the extension of the fourth insulating resin 24 cannot follow the elongation of the wiring substrate 6 when the member sealing the first semiconductor element 1A or the like is mounted on the wiring substrate 6, and the fourth insulating resin 24 is peeled off. Therefore, the thermal expansion coefficient of the fourth insulating resin 24 is preferably in the range of 20 [ppm/° C.] or more to 60 [ppm/° C.], and more preferably 20 [ppm/° C.] or more to 40 [ppmm/° C.]. When the thermal expansion coefficient of the fourth insulating resin 24 is smaller than 20 [ppm/° C.], the thermal expansion coefficient approaches the thermal expansion coefficient of the wiring substrate 6, and cannot follow the elongation of the wiring substrate 6, and the fourth insulating resin 24 may be easily peeled off. When the thermal expansion coefficient of the fourth insulating resin 24 is larger than 60 [ppm/° C.], the third resin may excessively elongated, and the fourth insulating resin 24 may be easily peeled off. The thermal expansion coefficient of the fourth insulating resin 24 is preferably 10% or more higher than the thermal expansion coefficient of the wiring substrate 6. The thermal expansion coefficient of the wiring substrate 6 is preferably 10% or more higher than the thermal expansion coefficient of the first insulating resin 4.

The elastic modulus of the fourth insulating resin 24 is preferably smaller than the elastic modulus of the first insulating resin 4 and the elastic modulus of the wiring substrate 6. More preferably, the relationship of the elastic modulus of the first insulating resin 4>the elastic modulus of the wiring substrate 6>the elastic modulus of the fourth insulating resin 24 is satisfied. Therefore, the elastic modulus of the fourth insulating resin 24 is preferably 0.1 [GPa] or more and 10 [GPa] or less, and more preferably 1 [GPa] or more and 5 [GPa] or less. When the elastic modulus of the fourth insulating resin 24 is less than 0.1 "GPa", it is difficult to fix the member sealing the first semiconductor element 1A by the fourth insulating resin 24. When the elastic modulus of the fourth insulating resin 24 exceeds 10 [GPa], the fourth insulating resin 24 be easily peeled off from the solder resist of the wiring substrate 6 due to warpage of the fourth insulating resin 24 and the wiring substrate 6. The elastic modulus of the first insulating resin 4 is preferably 10% or more higher than the elastic modulus of the wiring substrate 6. The elastic modulus of the wiring substrate 6 is preferably 10% or more higher than the elastic modulus of the fourth insulating resin 24.

In the first embodiment or the like, the first semiconductor element 1A and the second semiconductor element 9 overlap each other in the Z direction. However, the first semiconductor element 1A and the second semiconductor element 9 may not overlap each other in the Z direction.

In a case where the wiring structure of the embodiment is adopted, the layout of the second semiconductor element 9 used as, for example, a controller chip can be freely designed while improving the reliability of the wiring.

A plurality of semiconductor devices having the structure of the embodiment were manufactured, mounted on the wiring substrate 6, and subjected to a temperature cycle test to examine the reliability. The temperature cycle test was performed with −55 [° C.] (30 [min]) to 25 [° C.] (5 [min]) to 125 [° C.] (30 [min]) as one cycle. As a result, no breakage was observed at the connection site even after 3000 cycles.

Eighth Embodiment

Figure 30:
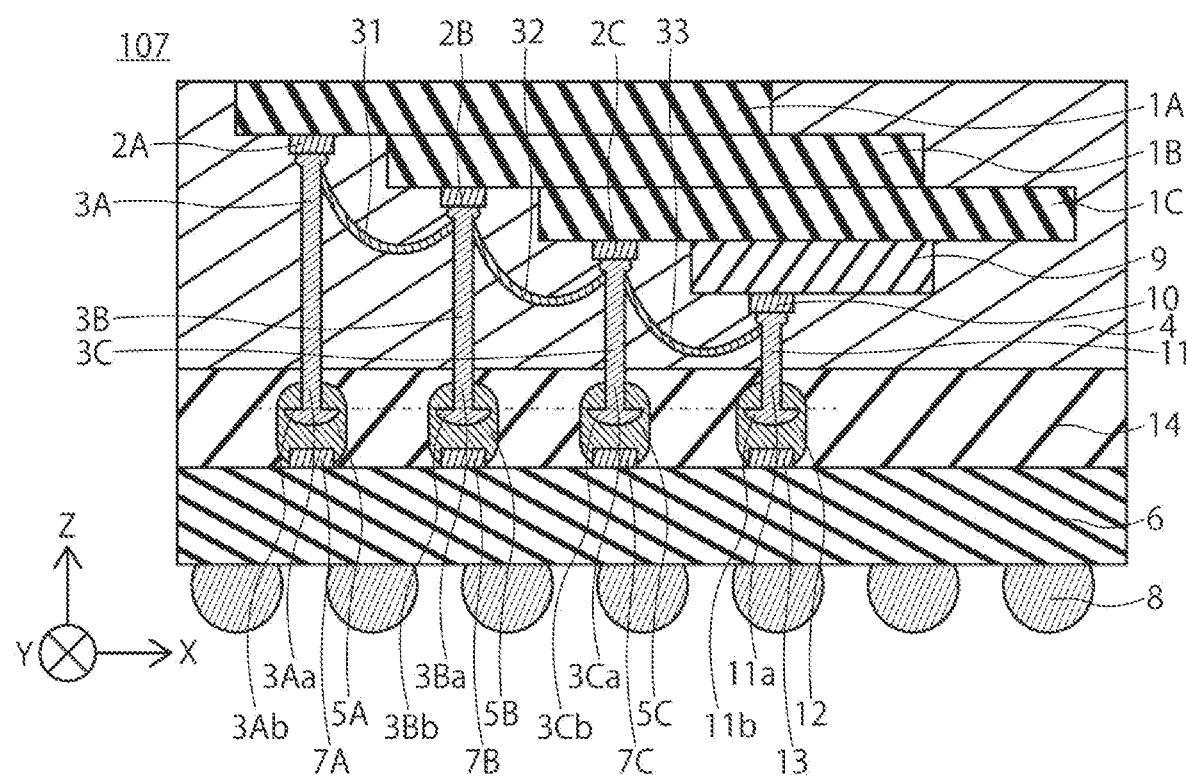
FIG. 30 is a schematic cross-sectional view of the semiconductor device according to the embodiment.

An eighth embodiment relates to a semiconductor device. FIG. 30 is a schematic cross-sectional view of a semiconductor device 107 according to an eighth embodiment. More specifically, the semiconductor device 107 of the eighth embodiment is a semiconductor package on which a NAND flash memory chip or the like is mounted. Description of contents common to the first embodiment, the second embodiment, the third embodiment, the fourth embodiment, the fifth embodiment, the sixth embodiment, the seventh embodiment, and the eighth embodiment will be omitted.

The semiconductor device 107 illustrated in FIG. 30 is a modification of the semiconductor device 101 of the first embodiment. In the first embodiment, the first semiconductor element 1A, the third semiconductor element 1B, the fourth semiconductor element 1C, and the second semiconductor element 9 are not connected to each other inside the first insulating resin 4. Alternatively, as illustrated in FIG. 30, the first pad 2A and the fifth pad 2B may be connected by a first wire bonding 31, the fifth pad 2B and the seventh pad 2C may be connected by a second wire bonding 32, and the seventh pad 2C and the third pad 10 may be connected by a third wire bonding 33. When the number of semiconductor elements included in the semiconductor device 107 is different, the bonding wire to be connected is changed from the form illustrated in FIG. 30. For example, in a case where the semiconductor element included in the semiconductor device 107 is the first semiconductor element 1A and the second semiconductor element 9, the first wire bonding 31 connects the first semiconductor element 1A and the second semiconductor element 9.

The first wire bonding 31 may be in direct contact with the first wiring 3A, or may not be in direct contact with the first wiring 3A and the two physically separated wirings (the first wiring 3A and the first wire bonding 31) may extend in different directions from the first pad 2A (the first wiring 3A may travel straight in a direction toward the wiring substrate 6, and the first wire bonding 31 may draw an arc in a direction toward the third semiconductor element 1B).

The second wire bonding 32 may be in direct contact with the third wiring 3B, or may not be in direct contact with the third wiring 3B and the two physically separated wirings (the third wiring 3B and the second wire bonding 32) may extend in different directions from the fifth pad 2B (the third wiring 3B may travel straight in a direction toward the wiring substrate 6, and the second wire bonding 32 may draw an arc in a direction toward the third semiconductor element 1B).

The third wire bonding 33 may be in direct contact with the fourth wiring 3C, or may not be in direct contact with the fourth wiring 3C and the two physically separated wirings (the fourth wiring 3C and the third wire bonding 33) may extend in different directions from the seventh pad 2C (the fourth wiring 3C may travel straight in a direction toward the wiring substrate 6, and the third wire bonding 33 may draw an arc in a direction toward the second semiconductor element 9).

The first wire bonding 31, the second wire bonding 32, and the third wire bonding 33 are, for example, wires selected from the group including Au, an Au alloy, an Ag alloy, Cu, and a Cu alloy. The first wire bonding 31, the second wire bonding 32, and the third wire bonding 33 may be coated with Pd or the like. The diameters of the first wire bonding 31, the second wire bonding 32, and the third wire bonding 33 are typically 10 [μm] or more and 50 [μm] or less.

All the stacked semiconductor elements may be further connected by wire bonding, or only some of the semiconductor elements may be further connected by wire bonding.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first semiconductor element;
   a first insulating resin that seals the first semiconductor element;
   a wiring substrate having a pad;
   a first wiring that extends from the first semiconductor element toward the wiring substrate, and has a first head portion and a first column portion, the first column portion connected to the first semiconductor element and the first head portion exposed on a surface of the first insulating resin;
   a first conductive bonding agent that electrically connects the first head portion of the first wiring and the pad; and
   a second insulating resin between the first insulating resin and the wiring substrate, wherein
   when a surface of the first head portion facing a side of the first insulating resin is defined as a first surface,
   a surface of the first insulating resin facing a side of the wiring substrate is defined as a second surface,
   a distance from a surface of the wiring substrate facing a side of the first insulating resin to the first surface is defined as a first distance,
   a distance from a surface of the wiring substrate facing the side of the first insulating resin to the second surface is defined as a second distance,
   the first distance is shorter than the second distance,
   a surface of the second insulating resin facing a side of the first insulating resin is in contact with the second surface,
   a surface of the second insulating resin facing a side of the wiring substrate is located closer to the side of the wiring substrate than the first surface,
   a thermal expansion coefficient of the second insulating resin is larger than a thermal expansion coefficient of the first insulating resin, and
   a composition of the first insulating resin is different from a composition of the second insulating resin.

2. The semiconductor device according to claim 1, wherein
   a difference between the first distance and the second distance is 50 nm or more and 5000 nm or less.

3. The semiconductor device according to claim 1, wherein
   the first surface is in direct contact with the first conductive bonding agent.

4. The semiconductor device according to claim 1, wherein
   the first surface is in direct contact with the second insulating resin.

5. The semiconductor device according to claim 1, wherein
   a diameter of the first column portion is 10 μm or more and 50 μm or less.

6. The semiconductor device according to claim 1, wherein
   a difference between the first distance and the second distance is 50 nm or more and 5000 nm or less.

7. The semiconductor device according to claim 1, wherein
   a diameter of the first column portion is 15 μm or more and 30 μm or less.

8. The semiconductor device according to claim 1, wherein
   a diameter of the first head portion is 15 μm or more and 100 μm or less.

9. The semiconductor device according to claim 1, further comprising:
   a second semiconductor element, wherein
   the second semiconductor element is sealed with the first insulating resin.

10. The semiconductor device according to claim 1, comprising:
    a third semiconductor element having a same circuit as the first semiconductor element except for an individual difference, wherein
    the third semiconductor element is stacked on a first semiconductor element.

11. The semiconductor device according to claim 1, wherein
    the first wiring includes a Cu linear conductor portion or a Cu linear conductor portion coated with Pd.

12. A method for manufacturing a semiconductor device comprising:
    a step of forming a columnar wiring extending in a direction perpendicular to a surface of a first semiconductor element;
    a step of sealing the first semiconductor element where the columnar wiring is formed with a first insulating resin;

a step of exposing a tip end of the columnar wiring;

a step of forming a first head portion by electroless plating the tip end of the exposed columnar wiring;

a step of thinning the first insulating resin on a side facing which the first head portion is formed; and a step of electrically connecting a first conductive bonding agent of the wiring substrate on which the first conductive bonding agent is formed and the first head portion of a member where the first head portion is exposed.

13. The method for manufacturing a semiconductor device according to claim 12, further comprising:

a step of etching the tip end of the columnar wiring between a step of exposing the tip end of the columnar wiring and a step of forming the first head portion by electroless plating the exposed tip end of the columnar wiring.

14. The method for manufacturing a semiconductor device according to claim 12, further comprising:

a step of forming a second insulating resin on a surface on which the first insulating resin is thinned; and a step of thinning the second insulating resin to expose the first head portion, between a step of thinning the first insulating resin facing the side on which the first head portion is formed and a step of electrically connecting the first conductive bonding agent of the wiring substrate on which the first conductive bonding agent is formed and the first head portion of the member on which the first head portion is exposed.

15. The method for manufacturing a semiconductor device according to claim 12, wherein a thickness for thinning the first insulating resin is 50 nm or more and 5000 nm or less.

16. The method for manufacturing a semiconductor device according to claim 12, wherein a thickness for thinning the first insulating resin is 100 nm or more and 1000 nm or less.

17. The method for manufacturing a semiconductor device according to claim 12, wherein a diameter of the first column portion is 10 μm or more and 50 μm or less.

18. The method for manufacturing a semiconductor device according to claim 12, wherein a diameter of the first column portion is 15 μm or more and 30 μm or less.

19. The method for manufacturing a semiconductor device according to claim 12, wherein a diameter of the first head portion is 15 μm or more and 100 μm or less.

20. The semiconductor device according to claim 1, wherein the second insulating resin is in direct contact with the first conductive bonding agent, the first conductive bonding agent is enclosed with the second insulating resin encapsulates, the first column portion is in direct contact with the first conductive bonding agent, the first column portion penetrates through the first insulating resin, the one end of the first column portion presents in the first insulating resin, the other end of the first column portion on the head portion side presents in the first conductive bonding agent, and a relation that the thermal expansion coefficient of the second insulating resin>a thermal expansion coefficient of the wiring substrate>the thermal expansion coefficient of the first insulating resin is satisfied.

* * * * *